(12) United States Patent
Zhao et al.

(10) Patent No.: US 9,899,194 B2
(45) Date of Patent: Feb. 20, 2018

(54) APPARATUS FOR PLASMA TREATMENT AND METHOD OF OPERATING THE APPARATUS

(71) Applicant: BEIJING NAURA MICROELECTRONICS EQUIPMENT CO., LTD., Beijing (CN)

(72) Inventors: Jinrong Zhao, Beijing (CN); Shaohua Liu, Beijing (CN); Gang Wei, Beijing (CN); Yulin Peng, Beijing (CN); Meng Yang, Beijing (CN); Yali Fu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 15/162,992

(22) Filed: May 24, 2016

(65) Prior Publication Data

US 2017/0301523 A1    Oct. 19, 2017

(30) Foreign Application Priority Data

Apr. 14, 2016   (CN) .......................... 2016 1 0232603

(51) Int. Cl.
| | |
|---|---|
| H01L 29/76 | (2006.01) |
| H01J 37/32 | (2006.01) |
| H01L 29/78 | (2006.01) |
| H01L 21/687 | (2006.01) |

(52) U.S. Cl.
CPC ..... *H01J 37/32715* (2013.01); *H01J 37/3211* (2013.01); *H01J 37/32183* (2013.01); *H01J 37/32816* (2013.01); *H01L 21/68714* (2013.01); *H01L 29/78* (2013.01)

(58) Field of Classification Search
CPC ................ H01L 29/78; H01L 21/68714; H01J 37/32715; H01J 37/32183; H01J 37/3211; H01J 37/32816
See application file for complete search history.

(56) References Cited

U.S. PATENT DOCUMENTS

| | | | | |
|---|---|---|---|---|
| 5,571,366 | A | * | 11/1996 | Ishii .................. H01J 37/32082 118/723 I |
| 6,143,144 | A | * | 11/2000 | Golovato .............. H01J 37/321 118/723 I |
| 6,277,237 | B1 | | 8/2001 | Schoepp et al. |

(Continued)

OTHER PUBLICATIONS

Search report from the Office Action of the counterpart Taiwan patent application No. 105117531.

*Primary Examiner* — Victor A Mandala
(74) *Attorney, Agent, or Firm* — Anova Law Group, PLLC

(57) ABSTRACT

Some embodiments of the present disclosure provide a semiconductor manufacturing apparatus. The semiconductor manufacturing apparatus includes a chamber, a support and a liner. The chamber is configured for plasma processes and includes a chamber wall. The support is configured to hold a wafer in the chamber. The liner is configured to surround the support and includes a top side and a bottom side. The top side is detachably hung on the chamber wait. The bottom side includes gas passages for plasma particles to pass through the liner.

20 Claims, 11 Drawing Sheets

(56) References Cited

U.S. PATENT DOCUMENTS

| | | | |
|---|---|---|---|
| 6,447,636 B1* | 9/2002 | Qian | H01J 37/32009 |
| | | | 118/723 I |
| 2002/0046991 A1* | 4/2002 | Smith | H01J 27/16 |
| | | | 219/121.57 |
| 2005/0115678 A1* | 6/2005 | Vesci | H01J 37/32623 |
| | | | 156/345.49 |
| 2006/0019477 A1* | 1/2006 | Hanawa | C23C 14/48 |
| | | | 438/514 |
| 2009/0090852 A1* | 4/2009 | Chen | H05H 3/06 |
| | | | 250/251 |
| 2014/0034240 A1* | 2/2014 | Kim | H01L 21/02 |
| | | | 156/345.33 |
| 2014/0225503 A1* | 8/2014 | Mori | H01J 37/32183 |
| | | | 315/111.21 |

\* cited by examiner

APPARATUS FOR PLASMA TREATMENT AND METHOD OF OPERATING THE APPARATUS

FIELD

The present disclosure relates to an apparatus for plasma treatment at method of operating the apparatus.

BACKGROUND

Plasma is commonly used in a semiconductor manufacturing process TO deposit layers of materials in the fabrication of semiconductor integrated circuits and is also used for etching of materials on a wafer.

In a deposition or etching operation, plasma is formed in a chamber of an apparatus. Various conditions in the chamber would affect the quality of a semiconductor device under fabrication.

SUMMARY

The present disclosure relates to an apparatus for semiconductor manufacturing, and a method of operating an apparatus including a match network for semiconductor manufacturing.

Some embodiments of the present disclosure provide a semiconductor manufacturing apparatus. The semiconductor manufacturing apparatus includes a chamber, a support and a liner. The chamber is configured for plasma processes and includes a chamber wall. The support is configured to hold a wafer in the chamber. The liner is configured to surround the support and includes a top side and a bottom side. The top side is detachably hung on the chamber wall. The bottom side includes gas passages for plasma particles to pass through the liner.

In an embodiment, the apparatus further includes a pump disposed under the chamber, and an exhaust tube coupled to the pump. The exhaust tube is a straight tube.

In another embodiment, the gas passages include a bottom opening at a bottom surface of the bottom side.

In yet another embodiment, the bottom opening has a cylindrical shape or cone shape.

In still another embodiment, the liner further includes a lateral side extending between the top side and the bottom side, and a corner at a joint of the lateral side and the bottom side.

In yet still another embodiment, the gas passages include a corner opening at the corner.

In a further embodiment, the corner opening is configured to form a passage way tilted with respect to a bottom surface of the bottom, side.

Embodiments of the present disclosure also provide a semiconductor manufacturing apparatus that includes a chamber designed to ignite plasma at a specified pressure. The semiconductor manufacturing apparatus includes a radio frequency (RF) source and a match network. The RF source is configured to generate an RF signal and supply electrical power at a first terminal and a second terminal. The match network is configured to couple the power from the RF source to the chamber to cause plasma ignition in the chamber at a pressure lower than the specified pressure. The match network includes a first circuit and a second circuit. The first circuit is configured to adjust a voltage level in response to the RF signal, and includes a first inductive device to output an adjusted voltage lead. The first inductive device and a capacitive circuit are connected in parallel between the first terminal and a reference voltage level. The second circuit includes a second inductive device to provide a predetermined voltage level for igniting plasma. The second inductive device is directly coupled between the second terminal and the reference voltage level.

In an embodiment, a maximum current node at the first inductive device and a maximum voltage node at the second inductive device are disposed symmetrically with respect to a central line of the chamber.

In another embodiment, the predetermined voltage level is higher than the adjusted voltage level.

In yet another embodiment, the first inductive device or the second inductive device includes an antenna in the form of a planar coil or helical coil.

In still another embodiment, the second inductive device is positioned closer to a central line of the chamber than the first inductive device.

In yet still another embodiment, the first it device and the second inductive device are concentrically around the central line.

In an embodiment, the apparatus further includes a shield configured to enclose the semiconductor manufacturing apparatus and the match network.

Some embodiments of the present disclosure provide a method of operating a semiconductor manufacturing apparatus that includes a match network. The method comprises applying a radio frequency (RF) signal to the match network, establishing an RF energy by the match network for generating a plasma in response to the RF signal, the match network including a first node and an inductive device having a first terminal coupled to the first node and a second terminal coupled directly to a reference voltage level, and including a second node between the first terminal and the second terminal, providing a predetermined voltage at the second node, igniting the plasma under the predetermined voltage level, and adjusting the match network to achieve an impedance match between the RF signal and the inductive device.

In an embodiment, providing the predetermined voltage at the second node comprises increasing a reactance of the match network.

Moreover, the predetermined voltage is higher than 1000 volts.

In another embodiment, providing the predetermined voltage at the second node comprises reflecting most of the RF signal from the inductive device.

In yet another embodiment, the match network includes another inductive device having a terminal coupled to the reference voltage level through a capacitive device.

In still another embodiment, the method further comprises enclosing the semiconductor manufacturing apparatus by a shield.

Some embodiments of the present disclosure provide a semiconductor device. The semiconductor device comprises a first region including devices arranged at a first density, and a second region, spaced apart from the first region, including devices arranged at a second density. The second density is smaller than the first density. A predetermined depth of the devices in the second region is equal to that of the devices in the first region. Moreover, an error rate of difference in depth between the devices in the first region and the devices in the second region with respect to the predetermined depth ranges frown approximately 6% to 8%.

In an embodiment, an error rate of average difference in depth between the devices in the first region and the devices in the second region with respect to the predetermined depth is 7%.

In another embodiment, a predetermined sidewall angle of the devices in the first region is equal to that of the devices in the second region, and an error rate of difference in sidewall angle between the devices in the first region and the devices in the second region with respect to the predetermined sidewall angle ranges from 4% to 7%.

In still another embodiment, an error rate of average difference in sidewall angle between the devices in the first region and the devices in the second region with respect to the predetermined sidewall angle is 6%.

In yet another embodiment, an error rate of difference in sidewall angle between a first sidewall and a second sidewall of the devices in the first region with respect to the predetermined sidewall angle ranges from 4% to 7%.

In yet still another embodiment, an error rate of average difference in sidewall angle between a first sidewall and a second sidewall of the devices in the first region with respect to the predetermined sidewall angle is 5.5%.

The semiconductor manufacturing apparatus and the method of operating an apparatus including a match network for semiconductor manufacturing are able to provide relatively high precision and repeatability and alleviate undesired effects that may deteriorate the quality of high-density integrated circuits in a wafer. These undesired effects include, for example, current leakage, non-uniform etching, pattern leading effect or micro-loading effect that may occur due to a relatively high circuit integration density.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
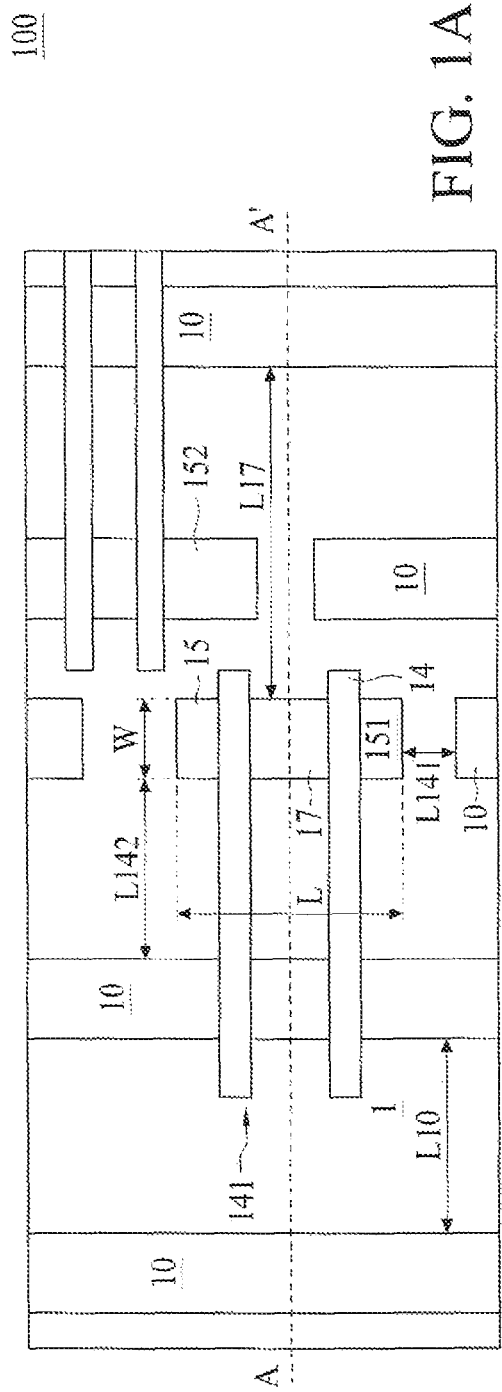
FIG. 1A is a plane view of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or features relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the continuous development in each semiconductor technology generation, transistor sizes decrease and the density of semiconductor devices on a wafer increases, resulting in a need for an ever higher degree of accuracy and repeatability in wafer processing. In a high density integrated circuit on a wafer, various effects could alter the quality of the wafer. For example, quality issues such as leakage current, non-uniform etching, pattern loading effect, or micro-loading effect could result from high density.

Etching, is a common process in modern approaches for integrated circuit (IC) production. Different etching technologies and methods, including plasma etching, are available. Of particular importance during etching processes is maintaining uniformity. Uniformity refers to evenness of etching for a critical dimension such as a desired depth, and evenness of etching across a wafer and from wafer to wafer. At microscopic level, etching rates and profiles depend on feature size and feature separation. Microscopic uniformity problems can be grouped into several categories including pattern-dependent etch effects, generally referred to as a pattern-loading effect. The pattern-loading effect includes macro loading effect or micro loading effect. More specifically, micro loading refers to dependence of etch rate on feature separation for identically sized features and results from depletion of reactants when the wafer has a local, higher-density area.

From a terminology standpoint, critical dimension simply refers to the dimension (e.g., width) of a feature in a direction of interest. For example, in a plane view 100 of a semiconductor device illustrated in FIG. 1A, a feature corresponding to a transistor 141 includes a gate structure 14, a drain region 15, and a source region 17. In some embodiments, the transistor 141 is a p-type metal-oxide-semiconductor (PMOS) field effect transistor, an n-type metal-oxide-semiconductor (NMOS) field effect transistor, or a complementary metal-oxide-semiconductor (CMOS) transistor. There can be multiple transistors 141 with different lengths or widths.

Referring to FIG. 1A, a circuitry includes a transistor conductive materials 10, and a semiconductor substrate 1. The transistor 141, having a length L and a width W, includes two gate structures 14 with a source region 17 and drain regions 15, 151 at either side of the source region 17. Length L is from one side of drain region 15 to one side of drain re ion 151. Width W is from a surface of the drain region 15 to another surface of the drain region 15. In some embodiments, the drain region 15 is separated from the conductive material 10 by a length L142. The drain region 15 can be separated from another conductive material 10 by a length L141.

The source region 17 is separated from the other conductive material 10 by a length L17. A distance between one conductive material 10 and another conductive material 10 is L10. Length L141, L142, L10 and L17 can be different, depending on circuit design.

Figure 1B:
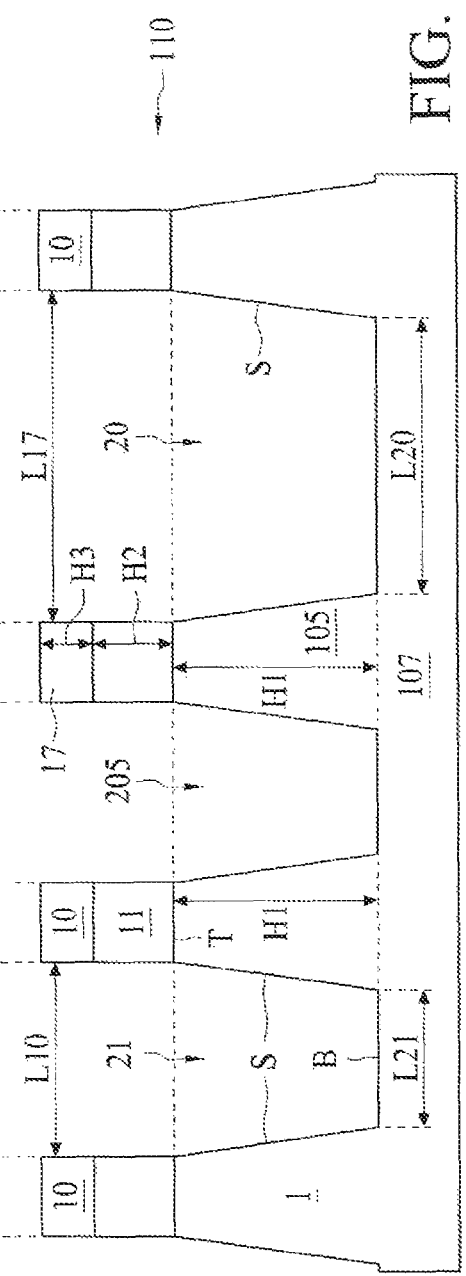
FIG. 1B is a cross-sectional view of the semiconductor device illustrated in FIG. 1A taken along a line AA', in accordance with some embodiments of the present disclosure.

Referring to FIG. 1B, a cross-sectional view 110 of the circuitry is taken along a cross-sectional line AA' passing through the source region 17 and conductive materials 10. Cross-sectional view 110 is aligned with the conductive materials 10, and shows the semiconductor substrate 1, the conductive materials 10, and an intermediate layer 11. The intermediate layer 11 is disposed between the semiconductor substrate 1 and the conductive materials 10. The conductive materials 10 are disposed over the semiconductor substrate 1. The semiconductor substrate 1 includes a recess 20 between the source region 17 and one conductive material 10. The recess 20 has a length L17 from a top of source region 17 to a top of the one conductive material 10. A bottom of the recess 20 has a length L20. In some embodiments, length L20 is smaller than length L17.

A recess 21 is disposed between two adjacent conductive materials 10. A distance between a top of one adjacent conductive material 10 and a top of the other adjacent conductive material 10 is length L10. The recess 21 includes a side S in conjunction with a bottom surface B of the recess 21. The bottom surface B includes a length L21. In some embodiments, the side S is tapered such that length L21 is smaller than length L10. In some embodiments, conductive material 10 has a height H3, and the intermediate layer 11 has a height H2. In some embodiments, height H3 is substantially equal for each of the conductive materials 10. The semiconductor substrate 1 includes a second portion 105 on a first portion 107. The second portion 105 includes a lateral side, and has a height H1 from the bottom surface B to a top surface T of the semiconductor substrate 1, in some embodiments, a different recess includes a different or similar size. For example, length L20 can be greater than, equal to, or smaller than length L21.

Figure 2A:
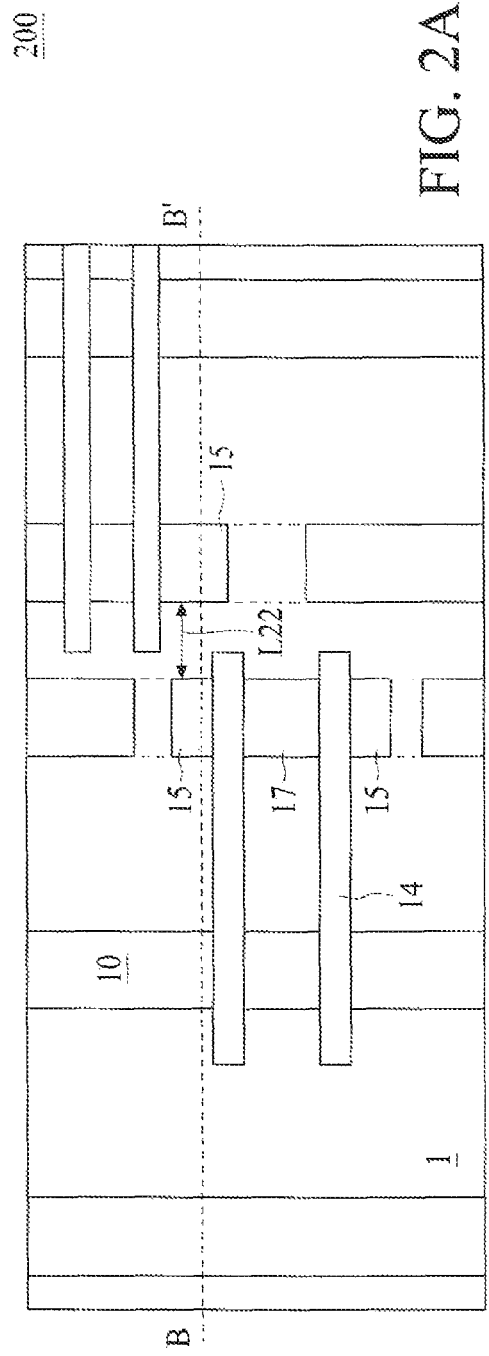
FIG. 2A is a plane view of a semiconductor device, in accordance with some embodiments of the present disclosure.
Figure 2B:
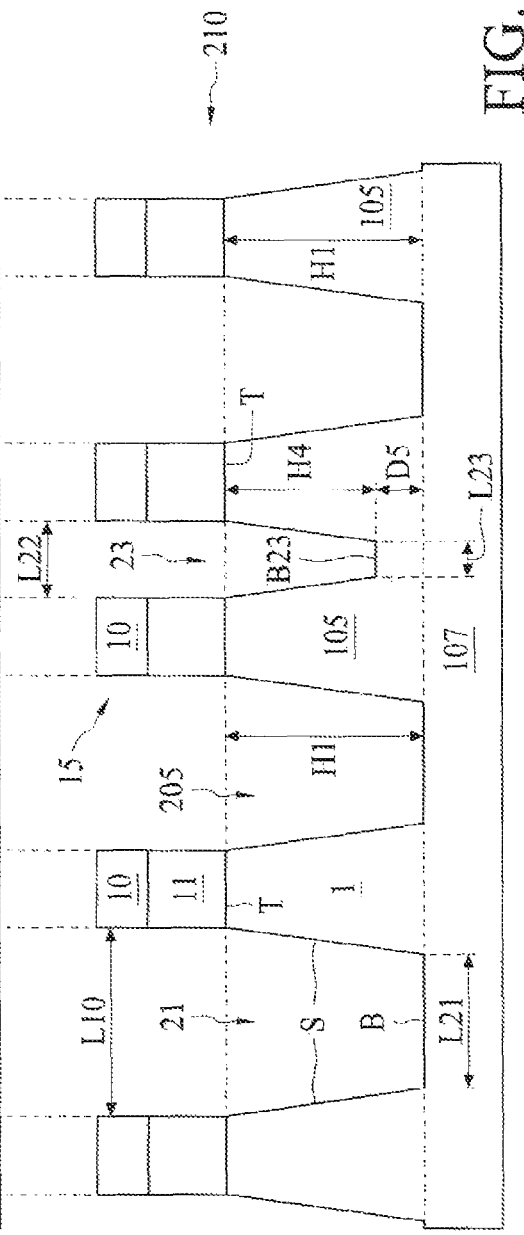
FIG. 2B is a cross-sectional view of the semiconductor device illustrated in FIG. 2A taken along a line BB', in accordance with some embodiments of the present disclosure.

In FIG. 2A, a plane view 200 of a circuitry is illustrated similar to FIG. 1A. In FIG. 2B, a cross-sectional view 210 of the circuitry is taken along a cross-sectional line BB' passing through on drain region 15 and another drain region 15. Cross-sectional view 210 is aligned with the conductive materials 10. In some embodiments, as a result of micro loading effect, different recesses have different depths such that bottom surfaces of different recesses are higher or lower than each other.

Length L22 is front one drain region 15 to the other, neighboring drain region 15. The conductive materials 10 are on top of the drain regions 15. The conductive material 10 and the intermediate layer 11 are substantially vertically aligned with each other such that length L22 is substantially constant from the top of conductive material 10 to a bottom of intermediate layer 11. A recess 23 is between the drain regions 15. The recess 23 includes a bottom surface B23 having a length L23. Moreover, the recess 23 is tapered such that length L23 is smaller than length L22. Bottom surface B23 is separated from the top surface T of the semiconductor substrate 1 by a height H4. Bottom surface B23 is higher than bottom surface B of the recess 21 by a distance D5. Height H4 is different from height H1 of the second portion 105 by a distance D5.

Figure 3:
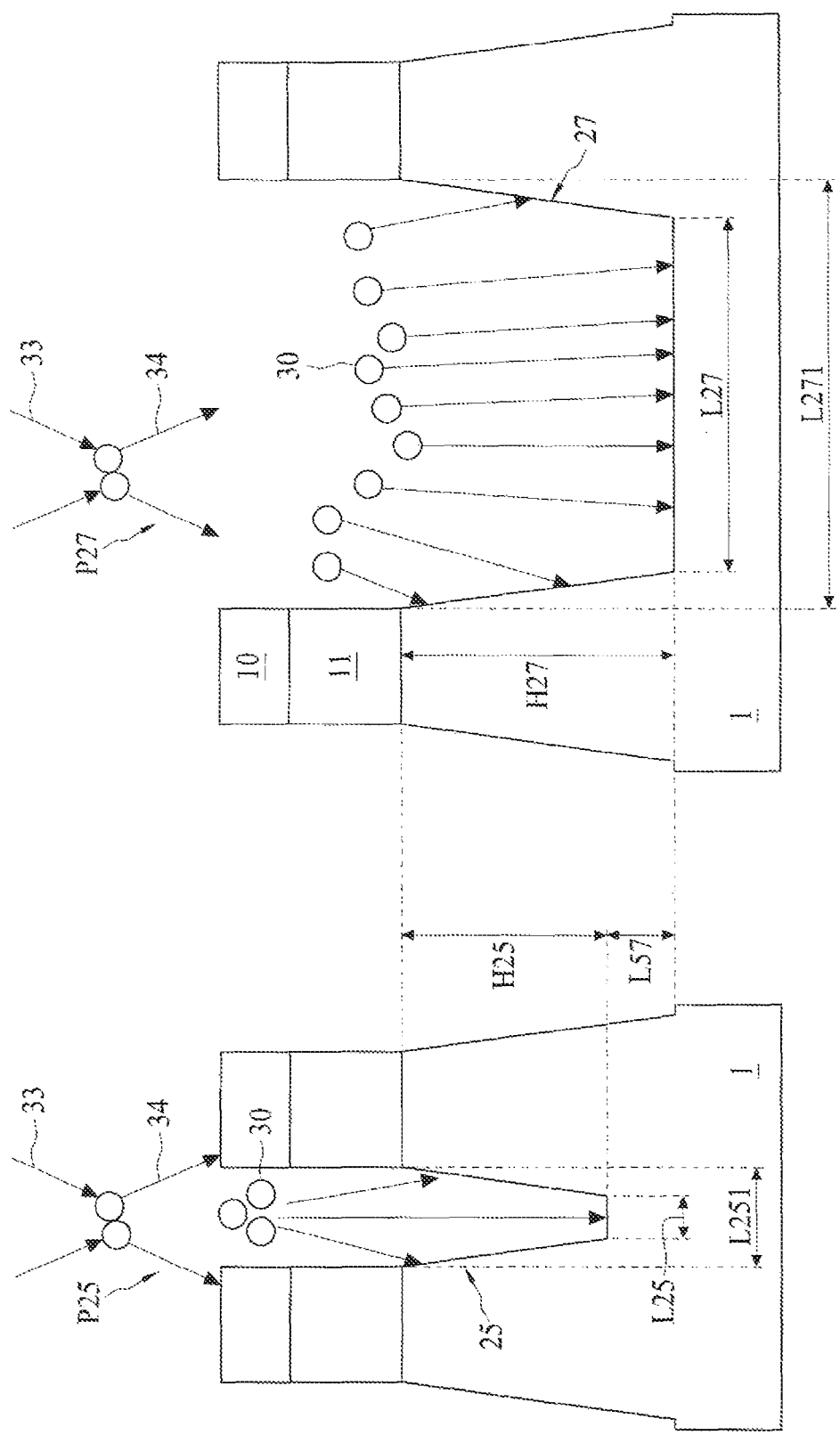
FIGS. 3 to 5 are cross-sectional views of a semiconductor device in accordance with some embodiments or the present disclosure.

One factor of micro loading effect is a process gas pressure inside a chamber during plasma treatment. In FIG. 3, a recess 25 is compared against a recess 27. The recess 25 is shallower than the recess 27 as a result of micro loading effect. The recess 25 includes a smaller opening P25 at a top, while the recess 27 includes a larger opening P27 at a top.

Further, the recess 25 has a length L251 at a top of the smaller opening P25 and a length L25 at a bottom surface of the recess 25. The recess 25 is tapered such that length L251 is greater than length L25. In addition, the recess 25 has a height H25 from the top of the smaller opening P25 to the bottom surface of the recess 25.

In contrast, the recess 27 has a length L271 at a top of the larger opening P27 and a length L27 at a bottom surface of the recess 27. Also, the recess 27 is tapered such that length L271 is greater than length L27. In addition, the recess 27 has a height H27 from the top of the larger opening P27 to the bottom surface of the recess 27.

By comparison, length L251 is smaller than length L271, and height H25 is smaller than height H27 by a length L57. In some embodiments, the recess 25 is more tapered than the recess 27 such that a ratio between length L251 and L25 is greater than a ratio between length L271 and length 27, given that the smaller opening P25 is smaller than the larger opening P27.

Plasma particles 30 remove portions of semiconductor substrate 1 under the smaller opening P25 or the larger opening P27 to form the recess 25 or 27, respectively. Some plasma particles 30 collide with each other before reaching the openings. Collision may occur above the smaller opening P25 or the larger opening P27. As a result, plasma particles 30 come together in an incident path 33 before the collision and spread out in a deflected path 34 after the collision. For incident path 33 with a horizontal component, a corresponding deflected path 34 can also have a horizontal component in the opposite direction. For collisions above the smaller opening P25, plasma particles 30 are snore likely to miss the smaller opening P25 and hence more likely to land on other regions outside of the smaller opening P25. For collisions above the larger opening P27, plasma particles 30 are less likely to miss the larger opening P27 and hence less likely to land on other regions outside of the larger opening P27. Consequently, for collisions above the larger opening P27, plasma particles 30 are still likely to enter into the larger opening P27 and more likely to etch into the semiconductor substrate 1 and form the recess 27 through, the larger opening P27.

In forming the recess 25 or recess 27 by using plasma particles 30 in an etch process, plasma particles 30 undergone the collision are more likely to enter into the larger opening P27 than the smaller opening P25. The larger opening P27 allows more collided plasma particles 30 to etch the recess 27 than the smaller opening P25 can allow. The recess 27 is deeper than the recess 25 as more collided plasma particles 30 are capable of etching the recess 27 than etching the recess 25. This non-uniform etching for different opening sizes is one of a cause of micro loading effect.

For plasma treatment with a higher collision rate, the micro loading effect becomes more significant such that recesses are less uniform, resulting in a wider variation in the depths of the recesses. Collision rate of plasma particles 30 is concerned with a mean free path of the plasma particles 30. As the mean free path is longer, collision is fewer. A low collision rate of most plasma particles 30 in a plasma treatment can mean most of the plasma particles 30 travel vertically downward to a wafer. Sideway collisions that include those in the horizontal direction are reduced so that more plasma particles 30 are allowed to etch into the smaller opening P25. Accordingly, increasing the mean free path of plasma particle 30 reduces the micro loading effect. One way of increasing the mean free path of plasma particles 30 is reducing process gas pressure.

Figure 4:
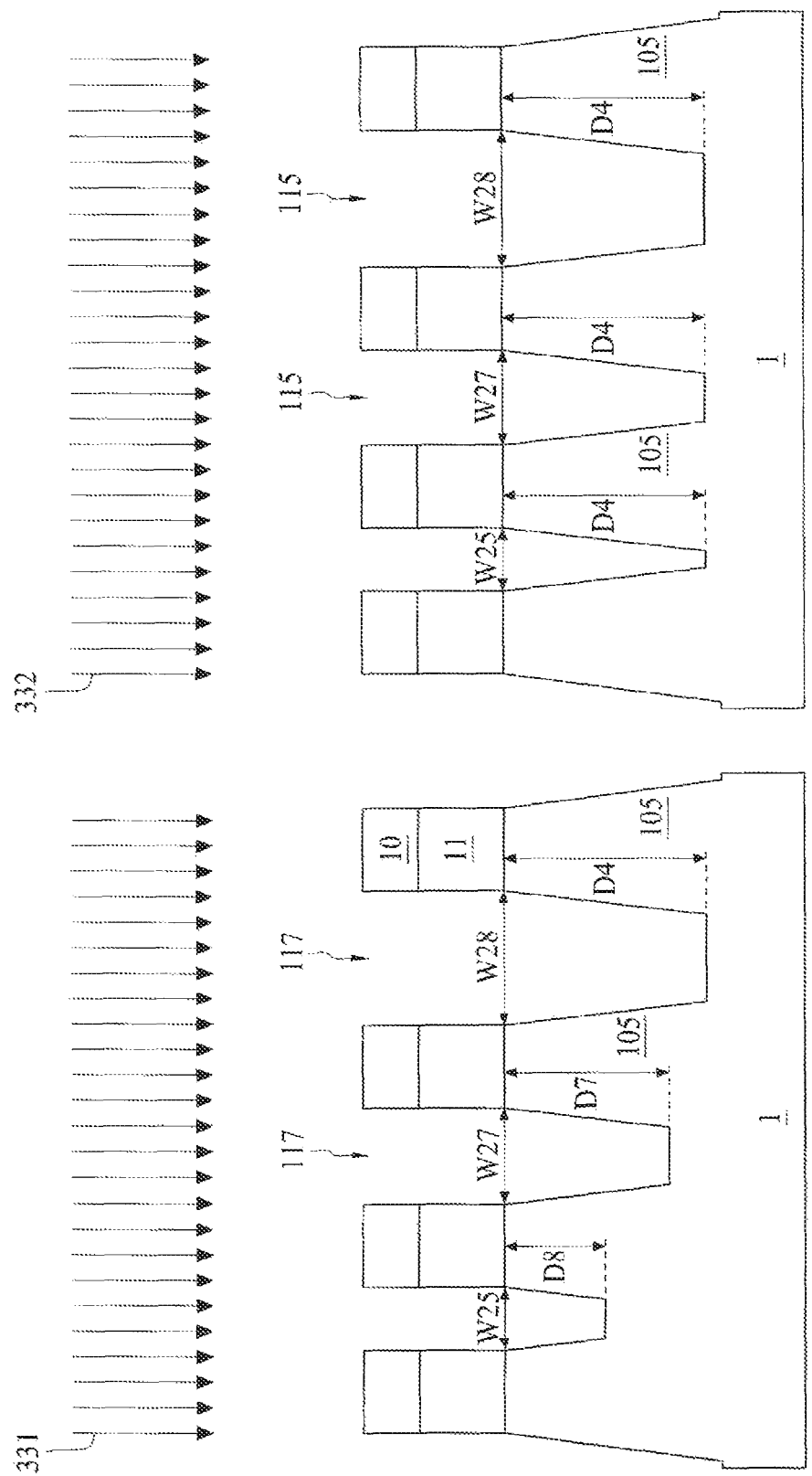

In FIG. 4, different plasma treatments 331 and 332 to etch semiconductor substrate 1 have different results, the micro loading effect is more significant in the plasma treatment 331 than the plasma treatment 332. For plasma treatment 331 with a more significant micro loading effect, the depth of recess decreases as the opening of a recess is smaller. For plasma treatment 332 with a less significant micro loading effect, the depth of recess remains substantially the same even as the opening of a recess is smaller. Openings of recesses can be, critical dimensions of recesses. Critical dimensions can be width W25, W27 or W28 of opening. In the present embodiment, width W28 is greater than width W27, and width W27 is greater than width W25.

Recesses 117 under plasma treatment 331 have widths W28, W27 and W25. Moreover, the recesses 117 have depths D4, D7 and D8. Depth D4 is greater than depth D7, and depth D7 is greater than depth D8.

Recesses 115 under plasma treatment 332 have widths W28, W27, and W25. Moreover, the recesses 115 have a substantially equal depth D4. Regardless of the size of the opening, the recesses 115 have a uniform depth D4.

Figure 5:
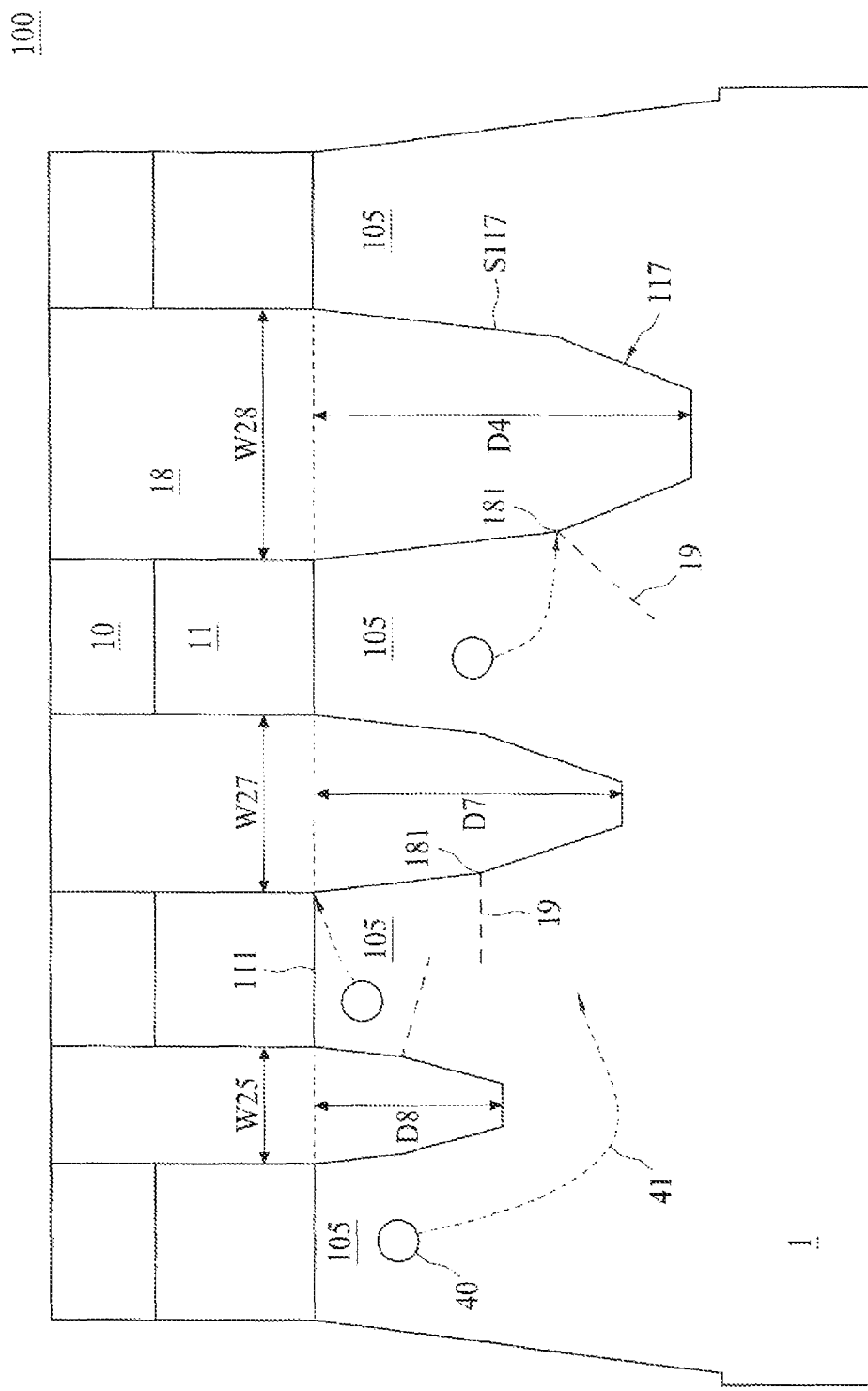

In FIG. 5, similar to the case in FIG. 4, micro loading effect may occur with respect to recesses 117. The recesses 117 are filled with an insulating material such as dielectric material to serve as an isolation structure 18. All exemplary recess 117 includes a bending 181 along a lateral side S117. A dislocation 19 extends from the bending 181 towards the semiconductor substrate 1. The dislocation 19 along the lateral side S117 is disposed near bending 181. An interface 111 exists between the semiconductor substrate 1 and the intermediate layer 11.

In FIG. 5, micro loading effect causes different degrees of leakage currents.

In some embodiments, for the isolation structure 18 with a shorter depth D8, charge carrier 40 is easier to travel from one second portion 105 to another second portion 105. For example, in some embodiments, the second portions 105 are those adjacent to the drain regions 15 in FIG. 2. Charge carrier 40 passes tinder the isolation structure 18 and leaks from one drain region to another drain region.

In some embodiments, charge carrier 40 leaks through the interface 111. In still some embodiments, charge carrier 40 leaks through the dislocation 19.

Reducing the process gas pressure increases the mean free path. Further, increasing the mean free path reduces the collision rate of plasma particles 30. Moreover, reducing the collision rate reduces micro loading effect. Consequently, reducing the micro loading effect reduces leakage current issue in a semiconductor device.

Figure 6:
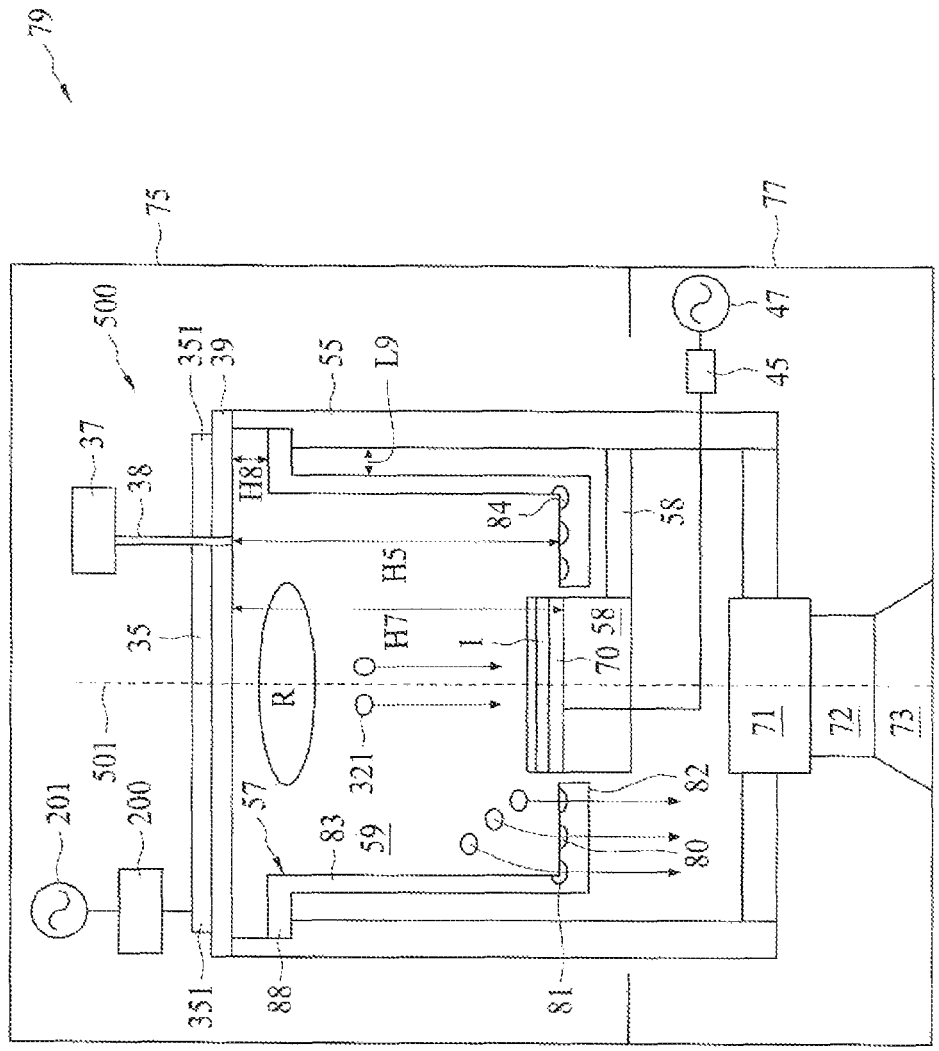
FIG. 6 is a cross-sectional view of an apparatus in accordance with some embodiments of the present disclosure.

FIG. 6 illustrates a semiconductor manufacturing apparatus 500. The semiconductor manufacturing apparatus 500 includes a plasma reaction chamber 59. The plasma reaction chamber 59 includes a liner 57. The liner 57 serves to confine the plasma. With the liner 57, distribution of an electric field can be changed, the plasma can be essentially confined in a region R inside the liner 57, and plasma density can be increased. The liner 57 may be used to protect the plasma reaction chamber 59 by preventing the plasma from eroding the other parts, such as chamber wall 55, of the plasma reaction chamber 59, and thus protect the plasma reaction chamber 59 from damage. The liner 57 can be cleaned and/or replaced. Moreover, the liner 57 can enhance the uniformity of process gas pressure. The uniformity of the process gas, pressure corresponds to that of the mean free path of as particles 321.

The region R is above a wafer 70 in the plasma reaction chamber 59. Wafer 70 includes semiconductor substrate 1. Maintaining a uniform process gas pressure distribution above semiconductor substrate 1 that undergoes plasma processing helps producing a uniform critical dimension in device dies on the semiconductor substrate 1. The pressure in a typical plasma reaction chamber 59 is controlled by introducing process can and evacuating the plasma reaction chamber 59 at the same time. With out arty restriction on process gas flow in the plasma reaction chamber 59, the process gas pressure may form a gradient from a relatively high pressure near an outlet of a gas feed 38 to a relatively low pressure near an evacuation port 71. The liner 57 partially restricting the process gas flow reduces the pressure gradient inside the liner 57. Reducing the pressure gradient increases the uniformity of the gas pressure.

The liner 57 can confine the process gas to a smaller volume and thus lower a feeding rate from the gas feed 38 and a consumption rate of the process gas.

The liner 57 includes various features. Specifically, the liner 57 includes a lateral portion 83 extending above the wafer 70. To achieve a high degree of uniformity of process gas pressure and plasma density, the liner 57 is preferably physically symmetric. The uniformity of process gas pressure and plasma density reduces micro loading effect across the wafer 70. In some embodiments, the liner 57 is symmetric with respect to the wafer 70 and free of openings in the lateral portion 83.

FIG. 6 is a cross-sectional diagram of the semiconductor manufacturing apparatus 500 including the plasma reaction chamber 59, liner 57, chamber wall 55, and a dielectric window 39 (e.g., a planar dielectric window of uniform thickness). Disposed above the dielectric window 39 is an inductive device 35. The inductive device 35 can be a planar multi-turn spiral coil, a non-planar multi-turn coil, or an antenna having another shape, powered by a suitable radio frequency (RF) source 201 through suitable RF impedance matching circuit 200 that inductively couples RF energy into the plasma reaction chamber 59 to generate plasma (e.g., a high density plasma). The impedance matching circuit 200 can also be a match network for matching impedances between the RF source 201 and the inductive device 35. The impedance matching circuit 200 can distribute power along the coils in the inductive device 35 to establish RF energy for generating plasma. The gas feed 38 is connected to a gas source 37 that supplies process gases into the plasma reaction chamber 59.

Directly below the dielectric window 39 is wafer 70 with the semiconductor substrate 1 under processing. The semiconductor substrate 1 is supported on a substrate support 58 incorporating a lower electrode which can be RF biased. The lower electrode is RF biased by another RF source 47. The RF source 47 is different from the RF source 201. Moreover, the RF source 47 is coupled to the lower electrode through an impedance matching circuit 45.

Around the substrate support 58 is the movable, symmetric liner 57. The liner 57 is detachably hung on the chamber wall 55. The liner 57 includes a bottom side 82 having a uniform thickness and provided with a plurality of gas passages. Moreover, the liner 57 is symmetrical with respect to the plasma reaction chamber 59. Also, the liner 57 is in a form of a circular ring with the center of the circular ring proximately at a central line 501 of the plasma reaction chamber 59. The liner 57 surrounds the substrate support 58. The center of the substrate support 58 is also substantially at the central line 501. The bottom side 82 can also be a horizontal portion proximately above the substrate support 58. The substrate support 58 holds the wafer 70 and is substantially orthogonal to the chamber wall 55. In some embodiments, the bottom side 82 is approximately at a same level with the substrate support 58. The substrate support 58, or simply referred to as a support, is disposed proximately in the center of the plasma reaction chamber 59. In some embodiments, the support extends from the chamber wall 55.

The lateral portion 83 is a continuous outer cylindrical wall of a uniform thickness, and extends upward axially from an outer perimeter of the bottom side 82. Moreover, the lateral portion 83 is substantially in parallel with the chamber wall 55. Also, the lateral portion 83 is spaced apart from the chamber wall 55 by a length L9. The outer perimeter is near a corner 84 at a joint of the lateral side 83 and the bottom side 82. A corner opening 81 is disposed proximately at the corner 84. The lateral portion 83 extends above the substrate support 58. The substrate support 58 is separated from the dielectric window 39 by a height H7. The bottom side 82 includes gas passages such as bottom opening 80. The corner 84 also, includes gas passages such as the corner opening 81. Gas passages such as the bottom opening 80 or the corner opening 81 allow gas particles 321 or plasma particles to fall through the liner 57. In some embodiments, the substrate support 58 is lower than, equal to, or higher than the bottom side 82.

Furthermore, the liner 57 includes a top side 88. The top side 88 includes a protruding portion to facilitate hanging the liner 57 on the chamber wall 55. In addition, the top side 88 is separated from the dielectric window 39 by a height H8, and the bottom side 82 is separated from the dielectric window 39 by a height H5.

The plasma reaction chamber 59 also includes a pump 73 disposed at a bottom. The pump 73 can be a symmetrical turbo pump aligned symmetrically with respect to the central line 501. Also, the pump 73 cart be a turbo pump to increase gas exhaust rate such that low pressure is developed inside the plasma reaction chamber 59. In some embodiments, the pump 73 can reduce pressure to be lower than around 1 millitorr. In addition, the pump 73 is placed symmetrically at the center of the plasma reaction chamber 59 to help lowing pressure uniformly inside the plasma reaction chamber 59. This increases uniformity of gas pressure near the wafer 70 for plasma treatment.

The pump 73 is coupled to an evacuation port 71 through an exhaust tube 72. The exhaust tube 72 is a straight tube free of any turning. A central axis of the exhaust tube 72 aligns in parallel with the central line 501 of the semiconductor manufacturing apparatus 500. In some embodiments, the evacuation port 71, exhaust tube 72, or pump 73 aligns symmetrically with respect to the central line 501.

A shield 79 encloses the semiconductor manufacturing apparatus 500 and the impedance matching circuits 200 and 45. The shield 79 prevents an external electrical or magnetic field from interfering with an electrical field, magnetic field, or any circuitries inside the shield 79. The shield 79 thus helps stabilizing plasma produced by the inductive electrical or magnetic field. Moreover, the shield 79 includes an upper shield 75 and a lower shield 77 to encapsulate the semiconductor manufacturing apparatus 500 entirely during plasma process.

Figure 7:
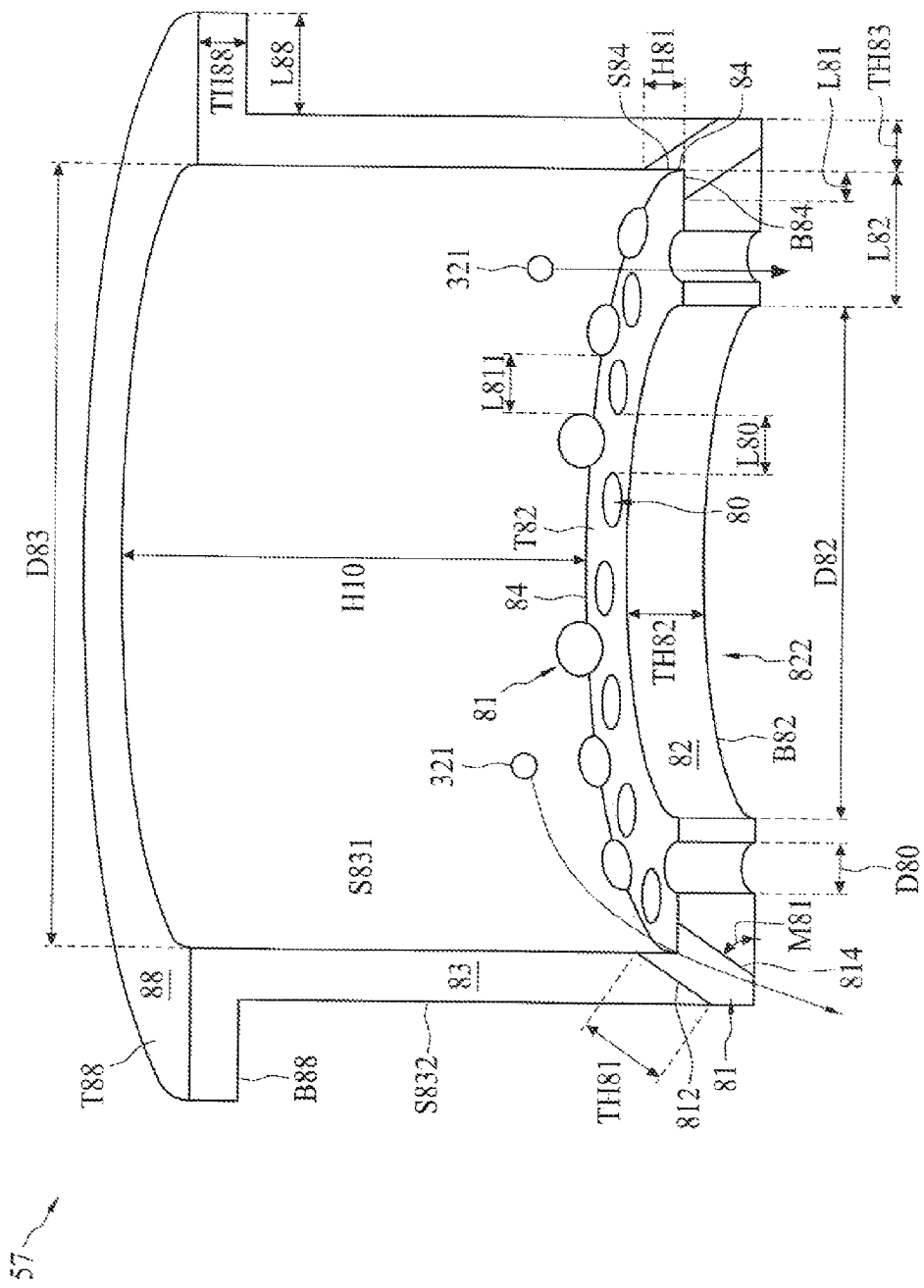
FIG. 7 is a cross-sectional view of a liner, in accordance with some embodiments of the present disclosure.

FIG. 7 is a cross-sectional view of the liner 57. As previously discussed, the liner 57 includes the top side 88, lateral portion 83, and bottom side 82. Referring to FIG. 7, the top side 88 includes a ring shape on top of the lateral portion 83. The corner 84 is in a form of a ring at a bottom of the lateral portion 83. Corner openings 81 are distributed around the ring of the corner 84. The bottom side 82 is a ring structure with bottom opening 80 distributed throughout the ring structure. In the ring structure an aperture 822 is defined to provide a space for accommodating the substrate support 58 described and illustrated with reference to FIG. 6. The substrate support 58 can fit symmetrically at the center of aperture 822. In some embodiments, the bottom side 82 is a horizontal side substantially orthogonal to the lateral portion 83. In other embodiments, the bottom side 82 is tilted from the lateral portion 83 by a degree suitable for gas particles 321 such as plasma to fall through the gas passages.

In FIG. 7, the top side 88 includes an upper surface T88 and a bottom surface B88. The bottom surface B88 is detachably mounted on the chamber wall 55 in FIG. 6 such that the bottom surface B88 contacts a top surface of the chamber wall 55. The top side 88 has a thickness TH88 measured vertically from the upper surface T88 to the bottom surface B88. In addition, the top side 88 protrudes from the lateral portion 83 by a length L88. The top side 88 includes a planar ring surrounding the lateral portion 83.

The lateral portion 83 is a cylindrical structure below the top side 88. Moreover, the lateral portion 83 has a thickness TH83 measured horizontally from an inner surface S831 to an outer surface S832. Also, the lateral portion 83 has a height H10 from the upper surface T88 to an upper surface T82 of the bottom side 82. Height H10 is measured proximately from the upper surface T88 to the corner 84. The cylindrical structure of the lateral portion 83 includes a diameter D83 of a circle surrounded by, an inner surface S831.

The bottom side 82 includes the upper surface T82 and a bottom surface B82. Thickness TH82 is measured vertically from the upper surface T82 to the bottom surface B82. The corner 84 is in conjunction between the upper surface T82 and the inner surface S831 of the lateral portion 83. The bottom side 82 has an aperture 822 synthetically aligned at the center of the liner 57.

The aperture 822 is in the form of a cylindrical shape with a diameter D82 and a height proximately equal to thickness TH82. Length L82 is measured from the corner 84 to the aperture 822 in a horizontal direction. The bottom side 82 includes bottom openings 80 scattered around the aperture 822. The bottom openings 80 may each include a cylindrical shape with a diameter D80 and a height proximately equal to thickness TH82. Diameter D82 is substantially greater than diameter D80. The bottom openings 80 are separated from each other by proximately length L80. The bottom openings 80 allow the gas particles 321 to pass through, the liner 57. In some embodiments, the bottom openings 80 may each include a cone shape such that a top surface and a bottom surface or the bottom opening 80 are different. For example, the bottom surface is smaller than the top surface of the bottom opening 80.

The corner opening 81 is disposed at the corner 84. The corner opening 81 includes a side surface S84. The side surface S84 includes a height H81 measured vertically along the inner surface S831 from the corner 84 to a topmost point of the corner opening 81. The side surface S84 is nonparallel with the bottom side 82. Moreover, the bottom side 82 is a horizontal portion. In some embodiments, the side surface S84 is orthogonal to the horizontal portion. The side surface S84 is in parallel with the lateral portion 83. In addition, the side surface S84 is coplanar with the inner surface S831. The corner opening 81 includes a bottom surface B84. The bottom surface B84 has as length L81 measured in parallel along the upper surface 182 from the corner 84 to an inmost point closest to the aperture 822. The corner openings 80 are separated from each other by proximately, length L811.

The corner opening 81 includes an upper surface 812 within the lateral portion 83. The upper surface 812 has a thickness TH81 measured from the topmost point at the inner surface S831 to a lower point at the outer surface S832. In some embodiments, the lower point is located at the bottom surface B82. The corner opening 81 includes a lower surface 814 within the bottom side 82. The lower surface 814 is from a topmost point at the upper surface T82 to a lower point at the bottom surface B82. In some embodiments, the lower point is located at the outer surface S832. The lower surface 814 tilts away from the bottom surface B82 by a degree M81. In some embodiments, the upper surface 812 is substantially in parallel with the lower surface 814. In some other embodiments, the upper surface 812 is nonparallel with the lower surface 814 such that the upper surface 812 tilts away from the bottom surface B82 by a degree different from the degree M81. The corner opening 81 is configured to form a passage way tilted with respect to the bottom surface B82 of the bottom side 82 to allow gas particles 321 travelling nearly toward the corner 84 to pass through the liner 57. This prevents gas particles 321 from travelling close to the corner 84 and therefor being deflected from the inner surface S831 or upper surface 182 near the corner 84.

Figure 8:
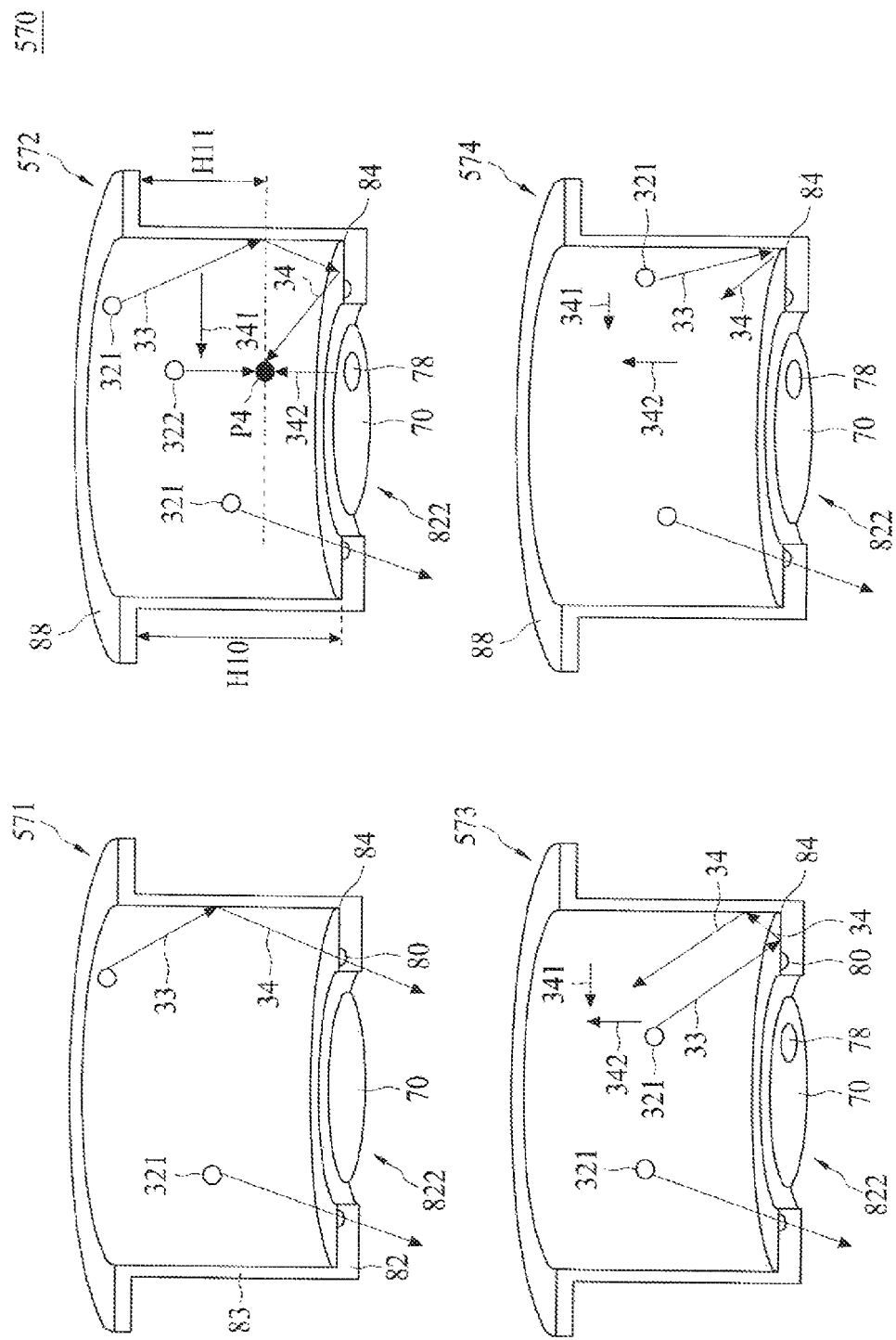
FIG. 8 is a cross-sectional view of a liner, in accordance with some embodiments of the present disclosure.

In FIG. 8, some possible paths for gas particles 321 to travel within the liner 570 are illustrated. Liner 570 is similar to the liner 57 in FIG. 7 except that liner 570 is free of corner opening 81 near the corner 84. The liner 57 includes bottom openings 80 at the bottom side 82.

In case 571, gas particles 321 traveling in an incident path 33 towards the lateral portion 83. Gas particles 321 bounce off the lateral portion 83 and travels in a deflected path 34. The deflected path 34 points toward the bottom side 82 and extends through the bottom opening 80.

In case 572, gas particles 321 traveling in the incident path 33 towards the lateral portion 83. Gas particles 321 bounce off the lateral portion 83 and the bottom side 82 to travel in the deflected path 34. The deflected path 34 points toward a region over the aperture 822 where the wafer 70 is placed. In addition, the deflected path 34 includes a vertical portion 342 pointing upward, and a horizontal portion 341 pointing sideway toward the wafer 70. The deflected path 34 is likely to cause gas particles 321 to collide with other gas particles 322 traveling downward toward the wafer 70. Gas particles 322 include nearly vertical direction pointing toward a region 78. The region 78 covers a predetermined area on the wafer 70 to be etched by gas particles 322. Such collision is similar to the collision in FIG. 3 and can decrease the mean free path of gas particles 322 within the liner 570. For example, without the collision, gas particles 322 can travel a distance H10 from the top side 88 to the wafer 70. However, the collision can shorten the distance for gas particles 322 to travel. Gas particles 322 collide with gas particles 321 at proximately position P4. Position P4 is below the top side 88 by a height H11. The distance for gas particles 322 to travel is shortened by a difference between height H10 and height H11. This shortening of the distance traveled by gas particles 322 reduces the mean free path of gas particles 322. Horizontal portion 341 can deflect gas particles 322 away from region 78. This collision exacerbates the micro loading effect on the wafer 70.

Case 573 is similar to case 572, except that gas particles 321 first hit the bottom side 82 then the lateral portion 83. In case 573, gas particles 321 travel in the incident path 33 towards the bottom side 82. Gas particles 321 bounce off the bottom side 82 and then deflect off the lateral portion 83 near the corner 84. Deflected path 34 points toward a region over the region 78 on the wafer 70. Deflected path 34 includes a vertical portion 342 pointing upward and a horizontal portion 341 pointing toward the wafer 70. Deflected path 34 is likely to cause collision with gas particles traveling toward the wafer 70 in a nearly vertical downward direction.

Case 574 is similar to case 573 or case 572, except that gas particles 321 hit closer to the corner 84 than in case 573 or case 572. Gas particles 321 hitting proximate to the corner 84 deflect off the bottom side 82 and/or the lateral portion 83 near the corner 84. By deflecting off the bottom side 82, gas particles 321 acquire the vertical portion 342 traveling upward toward the top side 88. By deflecting off the lateral portion 83, gas particles 321 acquire horizontal portion 341 traveling sideway toward the lateral portion 83. Deflected path 34 can cause collision with other gas particles and alter their direction and shorten their mean free paths.

The corner opening 81 in FIG. 7 eliminates deflection of gas particles 321 near the corner 84 by allowing gas particles 321 to pass through the corner 84. Most of the deflection with the bottom side 82 and/or lateral portion 83 that causes collision in the liner 57 can be eliminated. In particular, collision with the lateral portion 83 causes gas particles to travel sideway such that collided gas particles easily miss a predetermined etching area such as the region 78, especially when a size of the region 78 is relatively small. A collision that causes the horizontal portion 341 is a sideway collision. Gas particles, such as plasma particles 30 in FIG. 3, experience the sideway collision and miss the smaller opening P25 more likely than miss the larger opening P27 in FIG. 3. For smaller opening P25, a small amount of horizontal portion 341 can knock gas particles away from the smaller opening P25. For larger opening P27, a small amount of horizontal portion 341 can alter a direction of a gas particle but still allow the gas particles to fall within the larger opening P27. Sideway collision can cause micro loading effect by knocking more gas particles away from smaller opening P25 than from larger opening P27.

Another way to increase the mean free path of as particles is by lowering a pressure of the gas particles. However, as the pressure of the gas particles decreases, a voltage for igniting plasma from the gas particles increases. To increase the voltage, second inductive device 255 is connected directly to ground as shown in FIG. 9.

Figure 9:
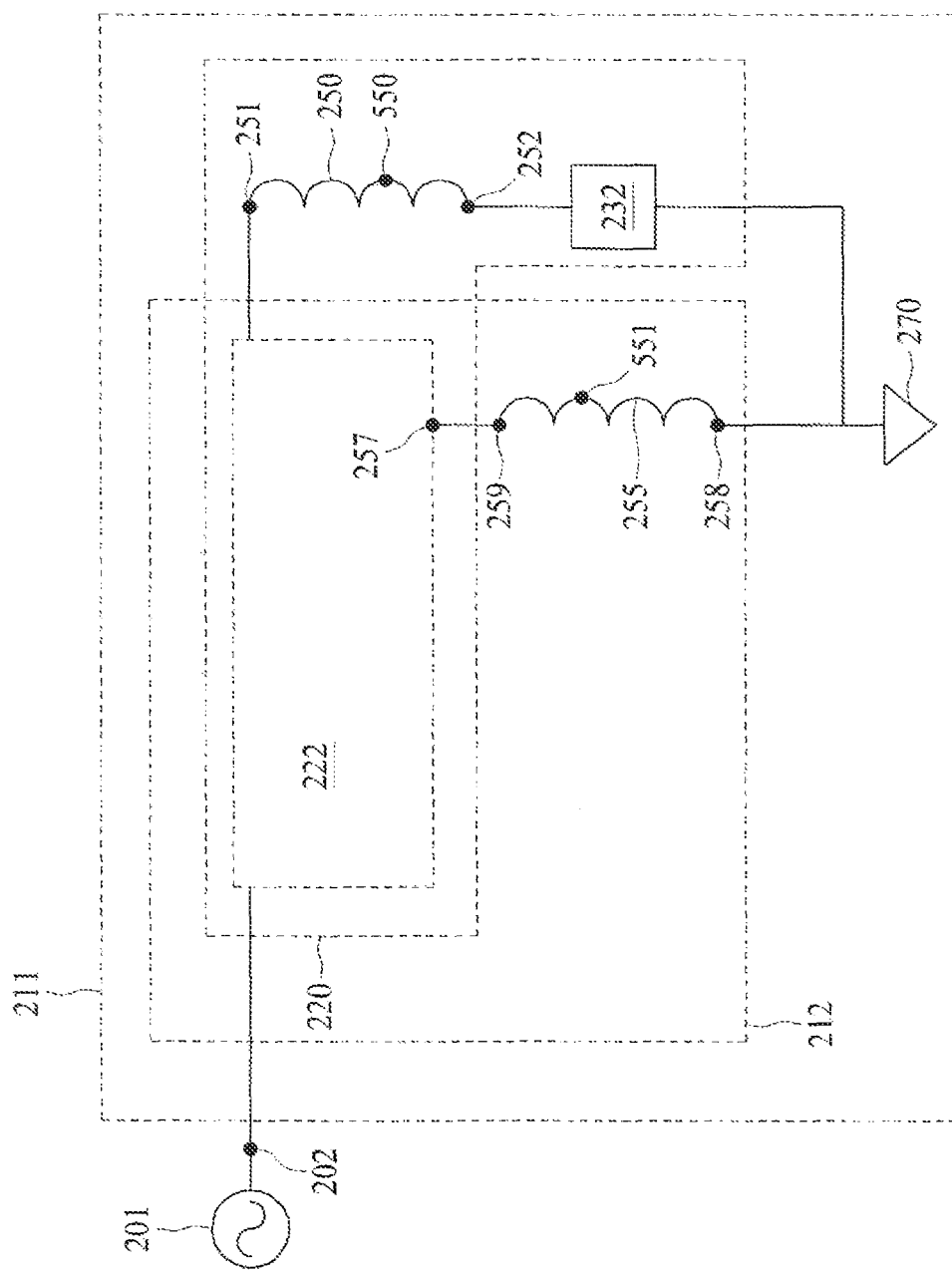
FIG. 9 is a block diagram of a match network, in accordance with some embodiments of the present disclosure.

FIG. 9 is a schematic diagram showing a match network 211. The match network 211 changes impedance in response to radio frequency (RF) power by an RF source 201. The match network 211 includes a first circuit 220 and a second circuit 212. Moreover, the match network 211 can be similar to a combination of the match circuit 200 and the inductive device 35 in FIG. 6.

First circuit 220 includes a circuit 222, a first inductive device 250 and a capacitive circuit 232. The First circuit 220 adjusts a voltage level at node 251 in response to a radio frequency (RF) signal from RF source 201. The first inductive device 250 is configured to output an adjusted voltage level. Node 251 is a first terminal of the first inductive device 250. Node 251 is located between the circuit 222 and the first inductive device 250. First inductive device 250 includes a second terminal at node 252. Node 252 is located between the first inductive device 250 and the capacitive circuit 232. Node 252 is coupled to a reference voltage level 270 through the capacitive circuit 232. The reference voltage level 270 can be a zero ground voltage. First inductive device 250 includes an inductance. First inductive device 250 is disposed similarly as inductive device 35 in FIG. 6. First inductive device 250 or second inductive device 255 includes a coil configuration to provide the RF energy such as electric field or magnetic field proximate to the region R in FIG. 6. First inductive device 250 or the second inductive device 255 can be an antenna with a shape of a planar coil or helical coil. Capacitive circuit 232 includes reactive elements such as a capacitor or an inductor. Capacitive circuit 232 includes a first capacitance substantially larger than a second capacitance between node 258 and the reference voltage level 270 in the second circuit 212. A current or a voltage varies at node 251 or node 252 depending on a reactance of the first inductive device 250 and a reactance of the capacitive circuit 232. In some embodiments, the circuit 222 is similar to the match circuit 200 in FIG. 6.

Second circuit 212 includes the circuit 222 and a second inductive device 255. The second circuit 212 provides a predetermined voltage level at point 551. The predetermined voltage level of the second circuit 212 is greater than the adjusted voltage level of the first circuit 220 during, an ignition of plasma. Second circuit 212 provides a predetermined voltage level to ignite the plasma. Plasma ignition may be conducted by using different gases. Each of the gases has a different minimum ignition voltage. For example, nitrogen ($N_2$) has an ignition voltage of approximately 250V, and oxygen ($O_2$) of approximately 440V. However, at a relatively low pressure region in the order of millitorr, due to low collision rate, plasma ignition is difficult. As a result, the hot spot voltage is higher, for example, about 800V to 1000V. In some embodiments, the predetermined voltage is proximately higher than 1000 volts.

The second inductive device 255 includes a first terminal, node 259, coupled to the second terminal, node 257, of the circuit 222, and includes a second terminal, node 258, coupled directly to the reference voltage level 270.

The RF source 201 can be a power supply supplying electrical power through circuit 222 to the first inductive device 250 or second inductive device 255. In some embodiments, the first inductive device 250 or second inductive device 255 is wound around an axis which is in parallel to the central line 501, i.e., perpendicular to a plane of the dielectric window 39 in FIG. 6. In some embodiments, an RF current through the first inductive device 250 or second inductive device 255 produces an RF electromagnetic field in the region R of the plasma reaction chamber 59 just below the dielectric window 39 so as to couple RF power to plasma and thereby enhance a density of the plasma in FIG. 6.

The circuit 222 may include a plurality of reactive elements. Inductors, capacitors, or a combination of inductors and capacitors can be used as the plurality of reactive elements. The capacitors or inductors can be connected to the power supply, in parallel or in series. The plurality of reactive elements can include fixed or variable capacitance or inductance. The number of reactive elements is variable in order to adjust a phase or magnitude of an applied voltage and current.

After the phase and magnitude of the applied voltage are changed by the reactive elements in the circuit 222, a distributed voltage is applied to the first inductive device 250 or second inductive device 255. In some embodiments, the circuit 222 can include capacitors connected to node 251 or node 257 in series or in parallel. Circuit 222 can adjust the distributed voltage or current in the first inductive device 250 and/or second inductive device 255 in response to an RF signal from the RF source 201. Circuit 222 can change the voltage or current differences between node 251 and node 252, between node 259 and 258, or between node 25 and node 259.

For first, inductive device 250 or second inductive device 255 wound in a shape of a spiral coil, a circular current pattern provided by such spiral coils creates toroidal-shaped plasmas which can in turn cause radial non-uniformity in etch rate at the wafer 70 in FIG. 6. In other words, E-field inductively generated by a planar coil antenna is generally azimuthal to make azimuthal plasma.

Some lengths of coupling lines used to construes the planar coil antenna, such as the first inductive device 250 or second inductive device 255 have certain electrical lengths at a radio frequency at which they typically operate. In some embodiments, Voltage and current waves traveling forward from a first terminal such as node 251 to a second terminal such as node 252 will be partially or totally reflected back at the second terminal. A superposition of a forward and reflected waves results in a standing wave on the coil (i.e., the voltage and current vary periodically along a length of the coil).

For the coil such as second inductive device 255 grounded at node 258, the current at node 258 is at a maximum value, and the voltage at node 258 is zero. Proceeding along the coil toward node 259, the voltage increases and the current decreases until, at point 551 which is 90 degrees of electrical length, the voltage is at maxi ruin and the current is at a minimum. In some embodiments, the voltage can be maximum near other locations such as node 259. Point 551 can be located anywhere between node 259 and node 258 according to the electrical length of second inductive device 255. Point 551 can be referred to as a hot spot where a maximum voltage is located along second inductive device 255. By coupling node 258 directly to ground, the maximum voltage is higher than the distributed voltages in first inductive device 250.

For the coil such as first inductive device 250, in some embodiments, node 252 is coupled with a capacitance in the capacitive circuit 232 such that the current in the coil is similar at both node 251 and node 252 and increases to a maximum near the middle of the coil. The voltage is highest at both terminals such as node 251 and node 252 and decreases to a minimum near the middle of the coil. In some embodiments, maximum voltages at both node 251 and node 252 are smaller than the maximum voltage at point 551 in the second inductive device 255.

A voltage varies in a direction along the length of the coil. For example, in second inductive device 255, point 551 is at the maximum voltage. On either side of point 551 the voltage drops off. Therefore, energy coupling to ignite plasma is higher beneath point 551 and corresponding plasma is more likely to form under point 551 than beneath node 259, node 258, or first inductive device 250. A relatively high voltage can be achieved by shorting second inductive device 255 directly to ground, such that discharge can be easily struck at a low pressure regime, typically less than 1 millitorr.

A system for improving an inductive coupling uniformity within an antenna system includes controlling a position and current distribution of the antenna to improve plasma uniformity.

According to some exemplary embodiments, two or more spiral coils are positioned on dielectric window 39 in FIG. 6. Each coil is either planar or a combination of both a planar coil and a vertically stacked helical coil. The capacitive circuit 232 determines where the current or voltage is at a maximum or a minimum in the first inductive device 250, while the reactive elements in the circuit 222 can change an overall impedance of each circuit such as the first circuit 220 or second circuit 212, and therefore, a ratio of current magnitudes in these multiple coils can be adjusted. By adjusting a magnitude of the current and a location of a maximum current in each coil, plasma density, and therefore, plasma uniformity, can be controlled.

In some embodiments, the electrical lengths of the coils can affect uniformity of voltage or current along the coils. For example, in some embodiments, the second inductive device 255 includes a shorter length than that of the first inductive device 250. In some embodiments, the voltage or current in the second inductive device 255 can be more uniform than in the first inductive device 250.

In some embodiments, the first inductive device 250 and the second inductive device 255 are two multiple-turn or single-turn coils. The second inductive device 255 is positioned closer to the central line 501, while the first inductive device 250 is positioned further away from the central line 501 and closer to an outer boundary 351 in FIG. 6. In some embodiments, the first inductive device 250 and the second inductive device 255 are concentrically around the central line 501. In addition, the first inductive device 250 and second inductive device 255 are symmetric with respect to the central line 501. In FIG. 9, an RF signal is simultaneously fed to the first inductive device 250 and second inductive device 255 through node 251 and node 259, respectively. Opposite ends of the first inductive device 250 and the second inductive device 255 are terminated to the capacitive circuit 232 and the reference voltage level 270, respectively. The two coils effectively generate more gradual toroidal-shaped plasma. In some embodiments, the currents flow in the first inductive device 250 and the second inductive device 255 are in a same direction with respect, to the central line 501 in FIG. 6. Power in electromagnetic fields coupling to the plasma from the coils spread out over region R and produce a single flattened toroidal-shaped plasma. For unbalanced currents between the first inductive device 250 and the second inductive device 255, a toroidal field of electromagnetic field can be stronger near the central line 501 or near the outer boundary 351. For example, by increasing current in the first inductive device 250, plasma density can increase near the outer boundary 351, or by increasing current in the second inductive device 255, plasma density can increase near the central line 501.

Reactive elements in the circuit 222 are provided for each coil so as to obtain a more symmetrical current distribution along the coils. For example, one can adjust the reactive elements so that a current maximum (as well as a purely resistive impedance point) occurs at a maximum point 550 in the first inductive device 250. Maximum point 550 can be at a half of the electrical length from node 251 or node 252. The current is highest in the maximum point 550 and is reduced away from the maximum point 550 in a normally sinusoidal fashion on either side. One can adjust capacitance of the capacitive circuit 232 to achieve a maximum current near the maximum point 550 of the first inductive device 250. As a result, power coupling to plasma is higher beneath the maximum point 550 and a corresponding plasma density is higher. In some embodiments, the maximum current achieves in the second inductive device 255 can be near node 258. A location of maximum point 550 in first inductive device 250 can be adjusted such that maximum point 550 and the hot spot are symmetrically located with respect to the central line 501 in FIG. 6. Maximum point 550 can be opposite of point 551 along a same radial axis. Therefore, a higher power coupling of the second inductive device 255 at node 258 offsets a high density plasma effect by maximum point 550 of the first inductive device 250, resulting in a more azimuthally uniform plasma. As an alternative to adjusting the reactance of the circuit 222 or capacitive circuit 232, an azimuthal position of the first inductive device 250 can be physically rotated relative to that of the second inductive device 255, so that current maxima in the first inductive device 250 and the second is device 255 are located opposite of each other on either side of the central line 501 in FIG. 6.

The match network 211 can achieve impedance match between the RF source 201 and the first inductive device 250 and/or between the RF source 201 and the second inductive device 255.

Match network 211 transforms an impedance of the first inductive device 250 and/or second inductive device 255 to match a characteristic resistive output impedance of a power supply such as the RF source 201. In some embodiments, the characteristic impedance is around 50 ohm. The reactive elements in the circuit 222 are adjusted to minimize a reflected power at an output 202 of the RF source 201. Match network 211 is adjusted for minimum reflected power.

Figure 10:
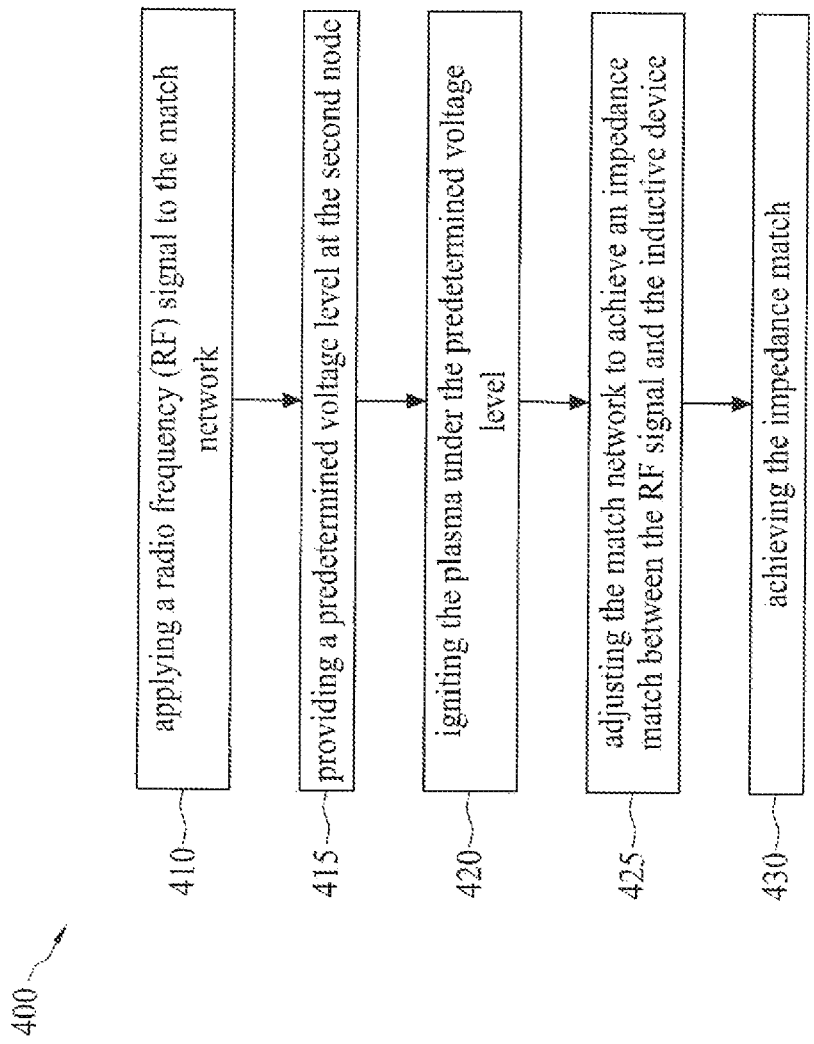
FIG. 10 is a flow diagram of a method for operating an apparatus, in accordance with some embodiments of the present disclosure.

In FIG. 10, a method 400 of operating semiconductor manufacturing apparatus 500 is illustrated. FIG. 10 illustrates an operational flow for operating semiconductor manufacturing apparatus 500 in FIG. 6. Operation 410 applies a radio frequency (RF) signal to the match network 211 in FIG. 9. Some exemplary embodiments for operation 410 are illustrated in operation 410 in FIG. 11. Operation 415 provides a predetermined voltage at the hot spot such as point 551 in FIG. 9. Some exemplary embodiments for operation 415 are illustrated in operation 415 in FIG. 11. Operation 420 ignites the plasma under the predetermined voltage level. Some exemplary embodiments for operation 420 are illustrated in operation 420 in FIG. 11. Operation 425 adjusts the match network 211 to achieve an impedance match between the RF signal and the inductive device 250 or 255 in FIG. 9. Some exemplary embodiments for operation 425 are illustrated in operation 425 in FIG. 11. Operation 430 achieves the impedance match. Some exemplary embodiments for operation 430 are illustrated in operation 430 in FIG. 11.

Figure 11:
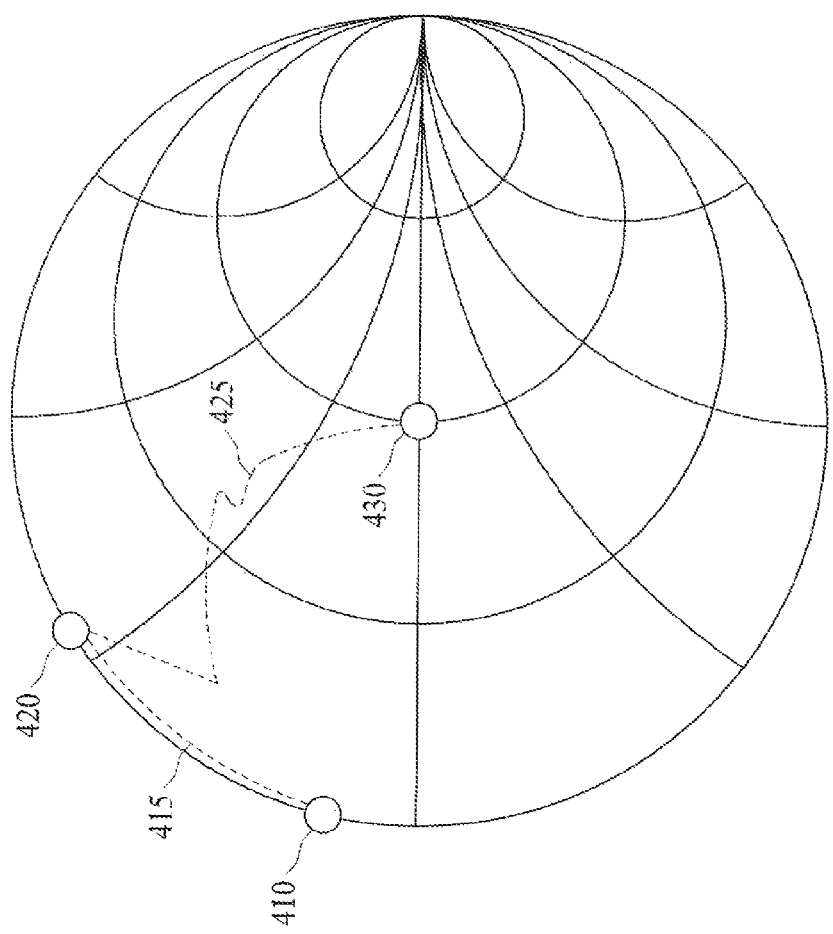
FIG. 11 is a chart for operation in conjunction with a match network, in accordance with some embodiments or the present disclosure.

In FIG. 11, a chart 401 for generating plasma includes operations 410, 415, 420, 425, and 430. Each operation represents a stage in a process of generating plasma. Plasma generation is useful in a variety of semiconductor fabrication processes, for example plasma enhanced etching and deposition. Plasmas are produced from a low pressure gas by electric field ionization and generation of free electrons which ionize individual gas molecules through a transfer of kinetic energy via individual electron-gas molecule collisions. The electrons are commonly accelerated in electric field, typically a radio frequency electric field.

In some embodiments, during plasma generation, the semiconductor manufacturing apparatus 500 is encapsulated by a shield 79 to prevent electromagnetic interference from outside. The plasma is generated in the plasma reaction chamber 59 at a pressure below a predetermined pressure. In some embodiments, the predetermined pressure is set to be around 2 millitorrs to reduce the micro loading effect during a plasma treatment.

In operation 410, a radio frequency source such as the RE source 201 is used to provide an oscillating current or voltage to en antenna system such as the first inductive device 250 or the second inductive device 255, typically via the match network 211 in FIG. 9. The oscillating current resonates through an antenna system, inducing an azimuthal electric field within the plasma reaction chamber 59 in FIG. 6. At the same time, a process gas is introduced into the plasma reaction chamber 59 via a gas feed 38, and the induced electric field ionizes the process gas to produce plasma within the plasma reaction chamber 59 in FIG. 6. The plasma then impinges upon the wafer 70, which is held in place by way of electrostatic chuck such as the substrate support 58, and processes (e.g., etching) the wafer 70 as desired.

In FIG. 11, during operation 410, impedance in match network 211 in FIG. 9 is mostly reactance with almost no resistance. This occurs when the RF source 201 starts to supply power to the match network 211. An RF signal establishes RF energy by the match network 211 for generating plasma in response to the RF signal. The RF energy is coupled from RF signal through the match network 211. The match network 211 in FIG. 9 include first node 257 and the second inductive device 255 having a first terminal such as node 259 coupled to the first node 257. Second terminal such as node 258 is coupled directly to the reference voltage level 270. Second node such as point 551 is a hot spot between the first terminal such as node 259 and the second terminal such as node 258. In some embodiments, the match network 211 includes another inductive device such as the first inductive device 250 having a terminal such as node 252 coupled to the reference voltage level 270 through a capacitive device in the capacitive circuit 232.

During operation 410, in some embodiments, the reactance is capacitive as shown in chart 401 in FIG. 11. The impedance lies at a point on a unity circumference circle indicating a short circuit between the RF source 201 and a load such as the first inductive device 250 and/or second inductive device 255.

During operation 410, the voltage is mostly reflected from the load. For example, the voltage transmitting toward the first inductive device 250 is reflected back toward the RF source 201. A ratio between the magnitude of the reflected voltage and the magnitude of the incident voltage is a reflection coefficient. The magnitude of the reflection coefficient is unity during operation 410, and nearly all power from the RF source 201 is reflected. Almost no plasma is formed during operation 410.

During operation 415, the impedance in the match network 211 in FIG. 9 is still mostly reactance with low resistance. In some embodiments, reactive elements in the circuit 222 are adjusted such that the capacitive reactance increases in the match network 211. Increasing the reactance to increase the voltage in the first inductive device 250 or second inductive device 255. During operation 415, the impedance still lies at a point on the unity circumference circle indicating a short circuit between the RF source 201 and the load. Nearly all power from the RF source 201 is reflected.

During operation 415, the voltage or current at point 551 starts to increase to reach a maximum voltage such as the predetermined voltage in the second inductive device 255. RF energy in the plasma reaction chamber 59 also increases to reach a maximum energy for plasma ignition. In some embodiments, depending on a variation of capacitance in the circuit 222 or capacitive circuit 232, the voltage at node 251 and node 252 are also increasing to reach another maximum voltage in the first inductive device 250. In some embodiments, the maximum voltage in the second inductive device 255 is higher than that of the first inductive device 250. Still almost no plasma is formed under point 551 during operation 415.

During operation 415, in some embodiments, the current at point 551 decreases to reach a minimum in the second inductive device 255. The current increases from point 551 toward either terminal such as node 259 or node 258.

During operation 420, the impedance in the match network 211 in FIG. 9 is, still mostly reactance with low resistance. The capacitive reactance reaches maximum at around 0.5 of the normalized it in chart 401.

During operation 420, in some embodiments, the voltage at point 551 reaches the maximum voltage in the second inductive device 255. In some embodiments, the maximum voltage is a predetermined voltage provided at the second node such as point 551. The predetermined voltage is proximately higher than 1000 volts. In some embodiments, the voltage at node 251 and node 252 are also reaching a maximum voltage in the first inductive device 250. At the maximum voltage, plasma ignition cuts in the region R, proximately beneath point 551. The plasma is ignited under the predetermined voltage level. In some embodiments, plasma ignition also occurs proximately beneath points such as node 251 or node 252 where the maximum voltage in First inductive device 250 occurs.

During operation 420, the current at point 551 increases from point 551 toward either side of point 551 and reaches a current maximum at either side close to node 259 or node 258. The density of plasma beneath the second inductive device 255 also increases from regions nearly under point 551 toward other regions under node 259 and/or node 258. In some embodiments, the current in first inductive device 250 also reaches the current maximum at some predetermined locations such that the density of plasma are substantially uniform with a location of each current maximum symmetrically arranged with respect to the central line 501 in FIG. 6.

During operation 425, the impedance in the match network 211 in FIG. 9 is adjusted such that both reactance and resistance are altered. The capacitive reactance changes automatically from a maximum at around 0.5 to an impedance matching point in chart 401. The impedance can be changed during operation 425 under various, ways. The impedance eventually reaches a center of chart 401 where the impedances of the coils such as the first inductive device 250 and/or second inductive device 255 equals to the characteristic impedance of the RF source. From operation 420 to operation 430, the resistance changes from around 0 to around 1 in a normalized impedance in chart 401. The reactance changes from around 0.5 to 0 in the normalized impedance.

During operation 425, in some embodiments, the voltage in the first inductive device 250 or second inductive device 253 changes according to an adjustment of the impedance in the match network 211. After the ignition of plasma, the voltage can be decrease to a lower voltage in either the inductive device 255 or 250. In some embodiments, the voltage at point 551 can be decreased to below the maximum voltage for the plasma ignition.

In operation 425, current in the first inductive device 250 or second inductive device 255 also changes according to the adjustment of the impedance in the match network 211. In some embodiments, operation 425 is to achieve uniformity of the current such that a difference of the magnitude of the current along the first inductive device 250 or second inductive device 255 is reduced. The magnitude of the current in the first inductive device 250 and second inductive device 255 are to be symmetrical with respect to the central line 501 in FIG. 6. The density of plasma formed corresponds to the magnitude of the current. Most of the plasma is formed during operation 425.

During operation 430, the impedance in the match network 211 in FIG. 9 are matched with an impedance of the RF source 201. The reactance of the impedance reaches around 0 in the normalized impedance in chart 401. The resistance reaches around 1 in the normalized impedance.

During operation 430, the voltage is mostly transmitted to the load. For example, the voltage transmitting toward node 251 is transmitted toward the first inductive device 250. The magnitude of the reflection coefficient is nearly 0 during operation 430, nearly all power from the RF source 201 is transmitted. In some embodiments, after the voltage decreases to a certain level, the voltage can stay for a certain period during the operation of the plasma treatment such as etching. Most of the plasma is form during operation 430.

In operation 430, current in the first inductive device 250 or second inductive device 255 are maintained such that the density of plasma is kept to be substantially uniform for a certain period during the operation of the plasma treatment.

The match network 211 and the method of operating a semiconductor manufacturing apparatus in accordance with the embodiments of the present disclosure enable the plasma reaction chamber 59, which would otherwise ignite plasma at a specified pressure, to ignite plasma at a pressure lower than the specified pressure, using the same process gas, so as to alleviate micro loading effect during plasma treatment. The specified pressure refers to a pressure at which a general plasma reaction chamber like the plasma reaction chamber 59, in the absence of the impedance match network 211 according to the present disclosure, is required to ignite plasma. For example, the specified, pressure is 3 millitorrs. In some embodiments, the plasma reaction chamber 59 in conjunction with the match network 211 enables plasma ignition at a relatively low pressure, for example, 2 millitorrs. The present disclosure, however, is not limited to any specific value or range of pressure, for example, the specified pressure, and hence the lower pressure for plasma ignition, may be different as the process gas is different.

Table 1 below shows experiment data of semiconductor devices at a first region (R1) and a second region (R2) in semiconductor wafers manufactured in accordance with the present disclosure. The first region is spaced apart from the second region. In addition, the density of semiconductor devices at the first region is larger than that at the second region. Accordingly, the first region is a dense region, while the second region is a sparse region. In Table 1, depths D1 and D2 refer to a distance between a bottom surface of a recess (which is subsequently filled by insulation material and therefore becomes an isolation structure) and a top surface of a semiconductor substrate. In some embodiments, a predetermined value for the depths D1 and D2 is 2700 angstroms (Å). Further, first sidewall angle (SWA1) refers to an angle between an upper sidewall (disposed between the bending 181 and the intermediate layer 11 as shown in, for example, FIG. 5) of a recess and a bottom surface of the semiconductor substrate. Moreover, second sidewall angle (SWA2) refers to an angle between a lower sidewall (disposed between the bending 181 and the bottom surface of a recess associated with the bending 181 as shown in, for example, FIG. 5) of the recess and the bottom surface of the semiconductor substrate. Ideally, the first and second sidewall angles SWA1, SWA2 are substantially 90 degrees. In addition, since no significant bending 181 may appear at the sparse region R2, sidewall angle SWA is deemed as an angle between the upper sidewall of a recess and a bottom surface of the semiconductor substrate.

TABLE 1

| wafer Nos. | R1 | | | R2 | |
|---|---|---|---|---|---|
| | depth (D1) (Å) | first sidewall angle (SWA1) (degrees) | second sidewall angle (SWA2) (degrees) | depth (D2) (Å) | sidewall angle (SWA) (degrees) |
| 1 | 2617 | 88.3 | 83.6 | 2792 | 83.2 |
| 2 | 2678 | 89.3 | 85.6 | 2836 | 83.6 |
| 3 | 2461 | 88.4 | 83.7 | 2614 | 85.4 |
| 4 | 2415 | 89.9 | 83.1 | 2583 | 84.1 |
| 5 | 2525 | 90.9 | 84.7 | 2695 | 85.4 |
| 6 | 2412 | 90.6 | 83.1 | 2546 | 85 |
| 7 | 2941 | 88.6 | 86.6 | 3133 | 82.2 |
| 8 | 2661 | 89 | 83.6 | 2949 | 85.1 |
| 9 | 2675 | 89.7 | 86.1 | 2872 | 84.1 |
| 10 | 2666 | 89.7 | 83.7 | 2882 | 83.5 |
| 11 | 2735 | 90.1 | 85 | 2967 | 83.6 |
| 12 | 2545 | 87.4 | 83.5 | 2730 | 83.2 |
| 13 | 2337 | 88 | 83 | 2489 | 84.1 |
| 14 | 2441 | 89.2 | 83.6 | 2632 | 83 |
| 15 | 2735 | 89.4 | 85 | 2963 | 83.2 |
| 16 | 2485 | 89.2 | 83.3 | 2714 | 83.3 |
| 17 | 2559 | 88.3 | 84.6 | 2747 | 83.2 |
| 18 | 2702 | 89 | 84.2 | 2890 | 84.3 |
| average | 2588.33 | 89.17 | 84.22 | 2779.67 | 83.86 |

It can be round from Table 1 that, due to micro loading effect, the depth D1 at the dense region R1 is smaller than the depth D2 at the sparse region R2, and the first sidewall angle SWA1 at the dense region R1 is greater than the sidewall angle SWA at the sparse region R2.

Table 2 below shows an analysis based on the experiment data in Table 1.

TABLE 2

| wafer Nos. | difference of depths between R1 and R2 (D2 − D1) (Å) | difference of sidewall angles between R1 and R2 (SWA1 − SWA) (degrees) | difference between first and second sidewall angles in R1 (SWA1 − SWA2) (degrees) |
|---|---|---|---|
| 1 | 175 | 5.1 | 4.7 |
| 2 | 158 | 5.7 | 3.7 |

TABLE 2-continued

| wafer Nos. | difference of depths between R1 and R2 (D2 − D1) (Å) | difference of sidewall angles between R1 and R2 (SWA1 − SWA) (degrees) | difference between first and second sidewall angles in R1 (SWA1 − SWA2) (degrees) |
|---|---|---|---|
| 3 | 103 | 3 | 4.7 |
| 4 | 168 | 5.8 | 6.8 |
| 5 | 170 | 5.5 | 6.2 |
| 6 | 134 | 5.6 | 7.5 |
| 7 | 192 | 6.4 | 2 |
| 8 | 288 | 3.9 | 5.4 |
| 9 | 197 | 5.6 | 3.6 |
| 10 | 216 | 6.2 | 6 |
| 11 | 232 | 6.5 | 5.1 |
| 12 | 185 | 4.2 | 3.9 |
| 13 | 152 | 3.9 | 5 |
| 14 | 191 | 6.2 | 5.6 |
| 15 | 228 | 6.2 | 4.4 |
| 16 | 229 | 5.9 | 5.9 |
| 17 | 188 | 5.1 | 3.7 |
| 18 | 188 | 4.7 | 4.8 |
| average | 191.33 | 5.31 | 4.94 |

It can be fund from Table 2 that, due to micro loading effect, the smallest difference between the depth D1 at the dense region R1 and the depth D2 at the sparse region R2 is approximately 134 Å (wafer No. 6), while the largest difference is approximately 288 Å (wafer No. 8). Given the predetermined depth of 2700 Å, the error rates of the smallest difference and the largest difference are 4.96% and 10.67%, respectively. In addition, the average difference between the depth D1 at the dense region R1 and the depth D2 at the sparse region R2 is approximately 191.33 Å, which means an error rate of 7.1% with respect to the predetermined depth of 2700 Å. In some embodiments, the error rate of the difference between the depth D1 at the dense region R1 and the depth D2 at the sparse region R2, with respect to the predetermined depth of 2700 Å, ranges from approximately 5% to 11%, and preferably 6% to 8%, while the average error rate is approximately 7%. Effectively, the difference of depths between a dense region and a sparse region due to micro loading effect is significantly reduced.

Also, due to micro loading effect, the smallest difference between the first sidewall angle SWA1 at the dense region R1 and the sidewall angle SWA at the sparse region R2 is approximately 3 degrees (wafer No. 3), while the largest difference is approximately 6.5 degrees (wafer No. 11). Given the predetermined angle of 90 degrees, the error rates of the smallest difference and the largest difference are 3.33% and 7.22%, respectively. In addition, the average difference between the first sidewall angle SWA1 at the dense region and the sidewall angle SWA at the sparse region R2 is approximately 5.31 degrees, which means an error rate of 5.9% with respect to the predetermined angle of 90 degrees. In some embodiments, the error rate of the difference between the first sidewall angle SWA1 at the dense region R1 and the sidewall angle SWA at the sparse region R2, with respect to the predetermined angle of 90 degrees, ranges from approximately 3% to 7.5%, and preferably 4% to 7%, while the average error rate is approximately 6%. Effectively, the difference of sidewall angles between a dense region and a sparse region due to micro loading effect is significantly reduced.

Due to different aspect ratios, the smallest difference between the first and second sideman angles SWA1, SWA2 at the dense region R1 is approximately 2 degrees (wafer No. 7), while the largest difference is approximately 7.5 degrees (wafer No. 6). Given the predetermined angle of 90 degrees, the error rates of the smallest difference and the largest difference are 2.22% and 8.33%, respectively. In addition, the average difference between the first and second sidewall angles SWA1, SWA2 at the dense region R1 is approximately 4.94 degrees, which means an error rate of 5.49% with respect to the predetermined angle of 90 degrees. In some embodiments, the error rate of the difference between the first and second sidewall angles SWA1, SWA2 at the dense region R1, with respect to the predetermined angle of 90 degrees, ranges from approximately 2% to 8.5%, and preferably 4% to 7%, while the average error arts is approximately 5.5%. Effectively, the difference of sidewall angles at a dense region due to different aspect ratios is significantly reduced.

The scope of the present disclosure is not intended to be limited to the particular embodiments of the process, machine, manufacture and composition of matter, means, methods and steps described in the specification. As one of ordinary in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture and compositions of matter, means, methods, or steps.

What is claimed is:

1. A semiconductor manufacturing apparatus, comprising:
a chamber, configured for plasma processes, including a chamber wall;
a support configured to hold a wafer in the chamber; and
a liner, configured to surround the support, including:
a top side detachably hung on the chamber wall, and
a bottom side including gas passages for plasma particles to pass through the liner.

2. The apparatus of claim 1 further comprising a pump disposed under the chamber, and an exhaust tube coupled to the pump, the exhaust tube being a straight tube.

3. The apparatus of claim 1, wherein the gas passages include a bottom opening at a bottom surface of the bottom side.

4. The apparatus of claim 3, wherein the bottom opening has a cylindrical shape or cone shape.

5. The apparatus of claim 1, wherein the liner further includes a lateral side extending between the top side and the bottom side, and a corner at a joint of the lateral side and the bottom side.

6. The apparatus of claim 5, wherein the gas passages include a corner opening at the corner.

7. The apparatus of claim 6, wherein the corner opening is configured to form a passage way tilted with respect to a bottom surface of the bottom side.

8. The apparatus of claim 1, wherein the liner is symmetric with respect to wafer to be disposed in the chamber.

9. The apparatus of claim 1, wherein the liner is free of openings in a lateral portion of the liner.

10. The apparatus of claim 1, wherein the liner is to confine plasma generated in the chamber.

11. A semiconductor manufacturing apparatus including a chamber designed to ignite plasma at a first pressure, the apparatus comprising:
a radio frequency (RF) source, configured to generate an RF signal and supply electrical power at a first terminal and a second terminal; and a match network, configured to couple the power from the RF source to the chamber to cause plasma ignition in the chamber at a second pressure lower than the first pressure, the match network comprising:
- a first circuit configured to adjust a voltage level in response to the RF signal as inputted at the first terminal, the first circuit including a first inductive device to output an adjusted voltage level, the first inductive device and a capacitive circuit being connected in parallel between the first terminal and a first voltage level; and
- a second circuit including a second inductive device to output a second voltage level to the chamber for igniting plasma at the second pressure, the second inductive device being directly coupled between the second terminal and the first voltage level, wherein the second voltage level is larger than the first voltage level.

12. The apparatus of claim 11, wherein a maximum current node in reference to a current of the first terminal at the first inductive device and a maximum voltage node in reference to a voltage of the second terminal at the second inductive device are disposed symmetrically with respect to a central line of the chamber.

13. The apparatus of claim 11, wherein the second voltage level is higher than the adjusted voltage level.

14. The apparatus of claim 11, wherein the first inductive device or the second inductive device includes an antenna in the form of a planar coil or helical coil.

15. The apparatus of claim 11, wherein the second inductive device is positioned closer to a central line of the chamber than the first inductive device.

16. The apparatus of claim 15, wherein the first inductive device and the second inductive device are concentrically around the central line.

17. The apparatus of claim 11 further comprising a shield configured to enclose the semiconductor manufacturing apparatus and the match network.

18. The apparatus of claim 11, wherein the apparatus is configured to manufacture a semiconductor device, wherein the semiconductor device includes:
- a first region including devices having a first density; and
- a second region, spaced apart from the first region, including devices having a second density, the second density smaller than the first density, and a second depth of the devices in the second region being equal to a first depth of the devices in the first region,
wherein an error rate of difference in depth between the devices in the first region and the devices in the second region with respect to the second depth ranges from 6% to 8%.

19. The apparatus of claim 18, wherein a first sidewall angle of the devices in the first region is equal to a second sidewall angle of the devices in the second region, and an error rate of difference in sidewall angle between the devices in the first region and the devices in the second region with respect to the first sidewall angle ranges from 4% to 7%.

20. The apparatus of claim 19, wherein an error rate of difference in sidewall angle between a first sidewall and a second sidewall of the devices in the first region with respect to the first sidewall angle ranges from 4% to 7%.

* * * * *